(12) United States Patent
Chen et al.

(10) Patent No.: US 11,815,567 B2
(45) Date of Patent: Nov. 14, 2023

(54) ELECTRONIC DEVICE

(71) Applicant: Innolux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/749,170

(22) Filed: May 20, 2022

(65) Prior Publication Data

US 2022/0276324 A1   Sep. 1, 2022

Related U.S. Application Data

(63) Continuation of application No. 17/070,932, filed on Oct. 15, 2020, now Pat. No. 11,366,179.

(51) Int. Cl.
*G01R 31/66* (2020.01)

(52) U.S. Cl.
CPC ................................ *G01R 31/66* (2020.01)

(58) Field of Classification Search
CPC .......... G01R 31/66; G01R 3/00; G01R 31/52; G01R 31/67; G01R 31/54; G06F 11/2215
See application file for complete search history.

(56) References Cited

U.S. PATENT DOCUMENTS

| | | | |
|---|---|---|---|
| 11,125,781 B1 * | 9/2021 | Hu | G01R 3/00 |
| 2008/0265399 A1 * | 10/2008 | Chao | H01L 23/49827 257/698 |
| 2011/0282593 A1 * | 11/2011 | Nickel | G01R 31/66 324/533 |
| 2012/0058653 A1 * | 3/2012 | Rathburn | G01R 3/00 439/76.1 |
| 2012/0279287 A1 * | 11/2012 | Andry | G01R 3/00 216/37 |

* cited by examiner

*Primary Examiner* — Akm Zakaria
(74) *Attorney, Agent, or Firm* — JCIPRNET

(57) ABSTRACT

An electronic device includes a substrate, an electronic element, a transistor, a redistribution layer and a plurality of first bonding pads. The electronic element is disposed on the substrate. The transistor is electrically connected with the electronic element. The plurality of first bonding pads are disposed on the redistribution layer.

10 Claims, 20 Drawing Sheets

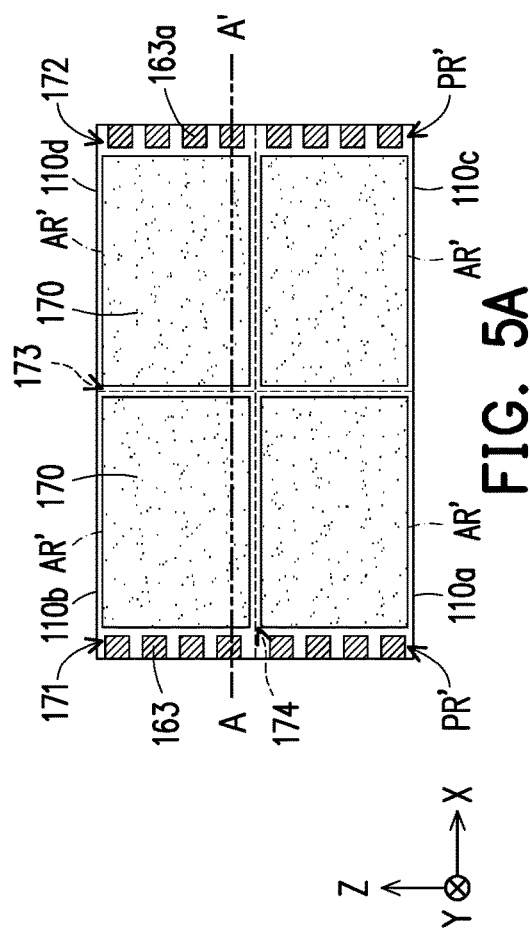
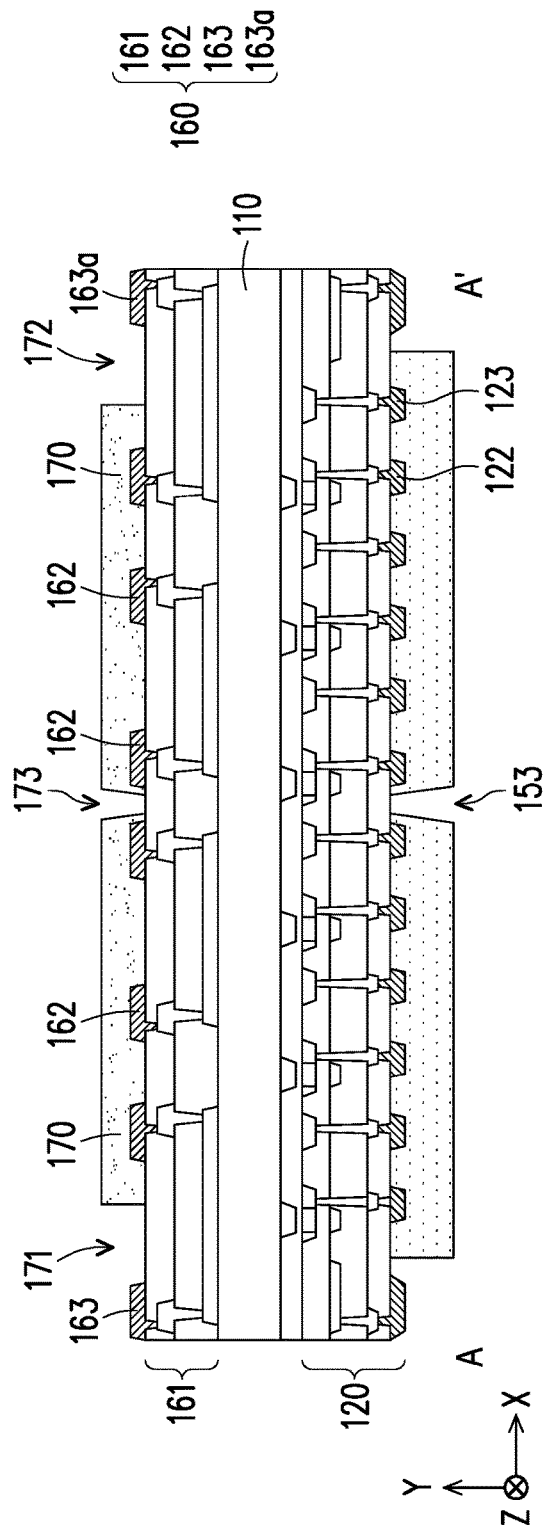

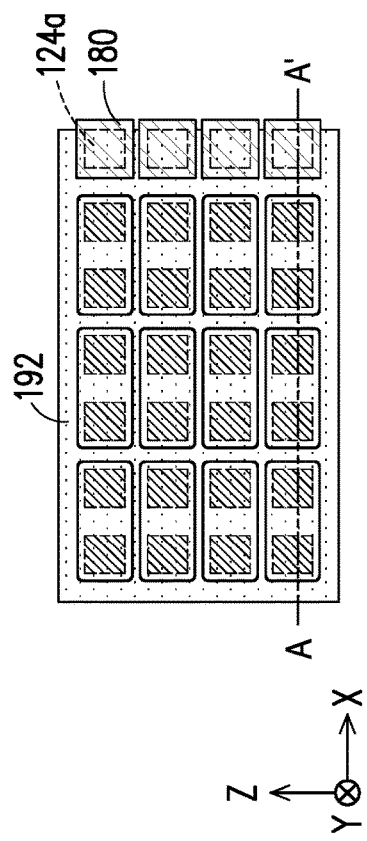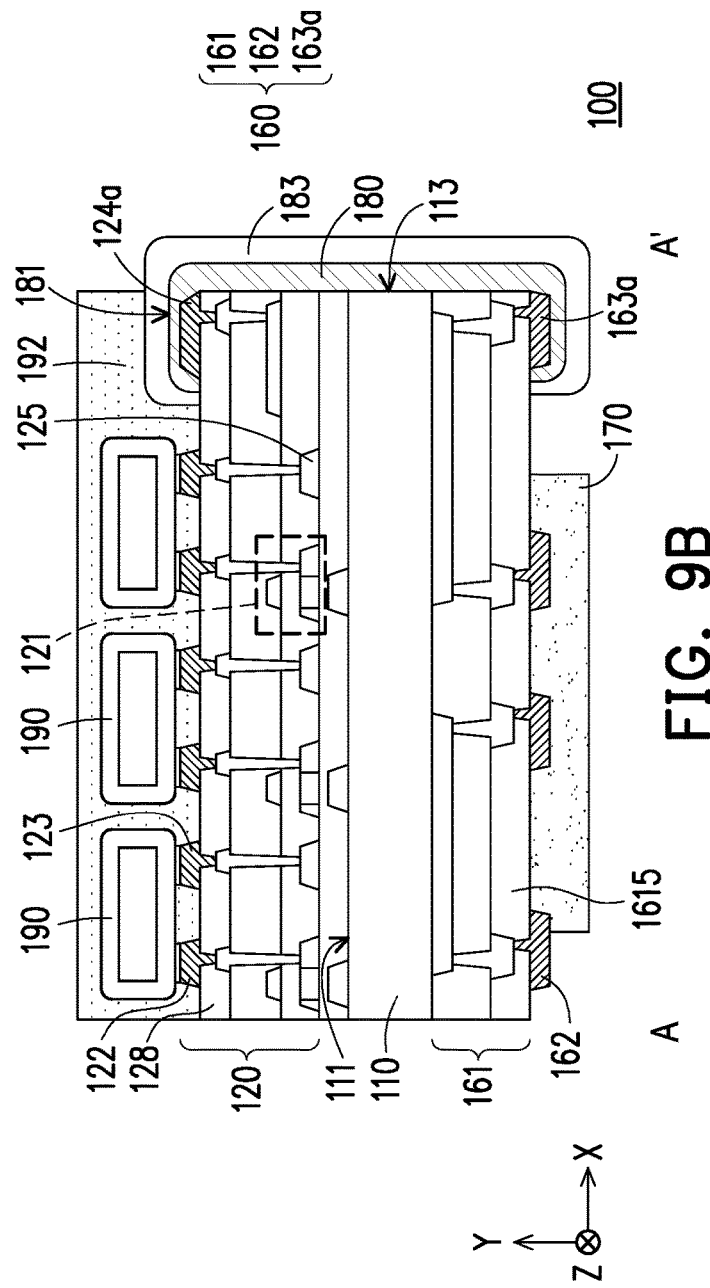
FIG. 9A
FIG. 9B

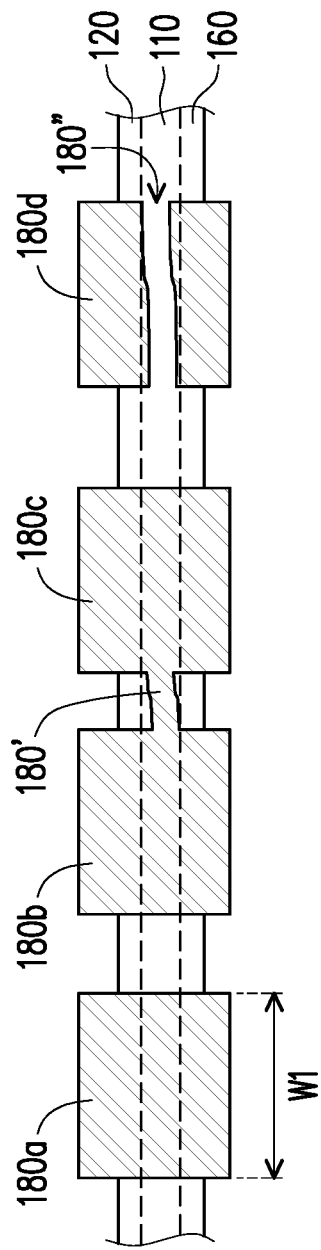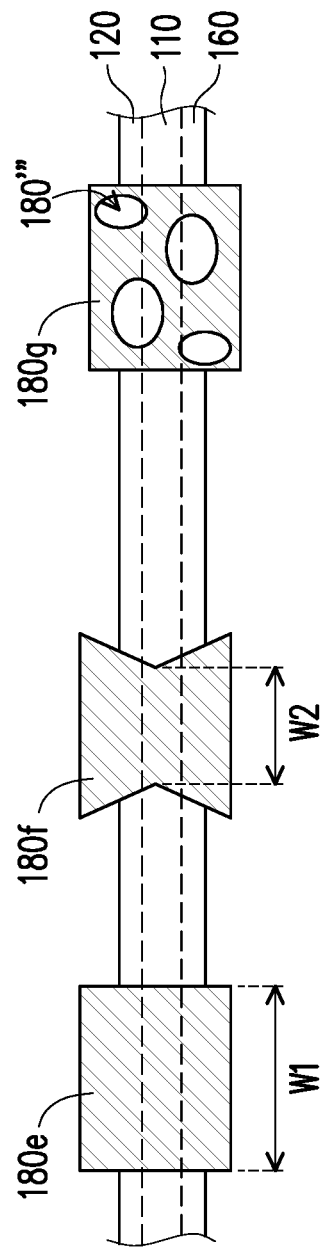

ELECTRONIC DEVICE

CROSS-REFERENCE TO RELATED APPLICATION

This application is a continuation application of and claims the priority benefit of U.S. application Ser. No. 17/070,932, filed on Oct. 15, 2020, now allowed. The entirety of the above-mentioned patent application is hereby incorporated by reference herein and made a part of specification.

BACKGROUND

Technical Field

The disclosure relates to an electronic device, and more particularly to a verified electronic device.

Description of Related Art

Electronic devices are widely used today. With rapid development of electronic devices, the requirements for the reliability of the electronic products are getting higher and higher, and it continues to develop methods of verifying the electronic devices.

SUMMARY

The disclosure is directed to a method of manufacturing an electronic device, which includes verifying the electrical connection between the circuits in the electronic device.

According to an embodiment of the disclosure, a method of manufacturing an electronic device includes the following steps. A substrate is provided, and the substrate has a first surface, a second surface opposite to the first surface and a side surface between the first surface and the second surface. A first circuit is formed on the first surface. A second circuit is formed on the second surface. The first circuit is made to electrically connect with the second circuit. A testing signal is applied to the first circuit and received from the second circuit to verify the electrical connection between the first circuit and the second circuit.

According to an embodiment of the disclosure, an electronic device includes a substrate, an electronic element, a transistor, a redistribution layer and a plurality of first bonding pads. The electronic element is disposed on the substrate. The transistor is electrically connected with the electronic element. The plurality of first bonding pads are disposed on the redistribution layer.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of the specification. The drawings illustrate exemplary embodiments of the disclosure and, together with the description, serve to explain the principles of the disclosure.

FIGS. 2A, 3A, 4A, 5A, 6A, 7A, 8A, and 9A are schematic top views of a method of manufacturing an electronic device according to an embodiment of the disclosure.

FIGS. 2B, 3B, 4B, 5B, 6B, 7B, 8B, and 9B are schematic cross-sectional views of the structure of FIG. 2A to FIG. 9A along the section line A-A'.

FIG. 10A and FIG. 10B are schematic side views of the structure of FIG. 7B when performing an optical inspection.

DESCRIPTION OF THE EMBODIMENTS

Figure 1:
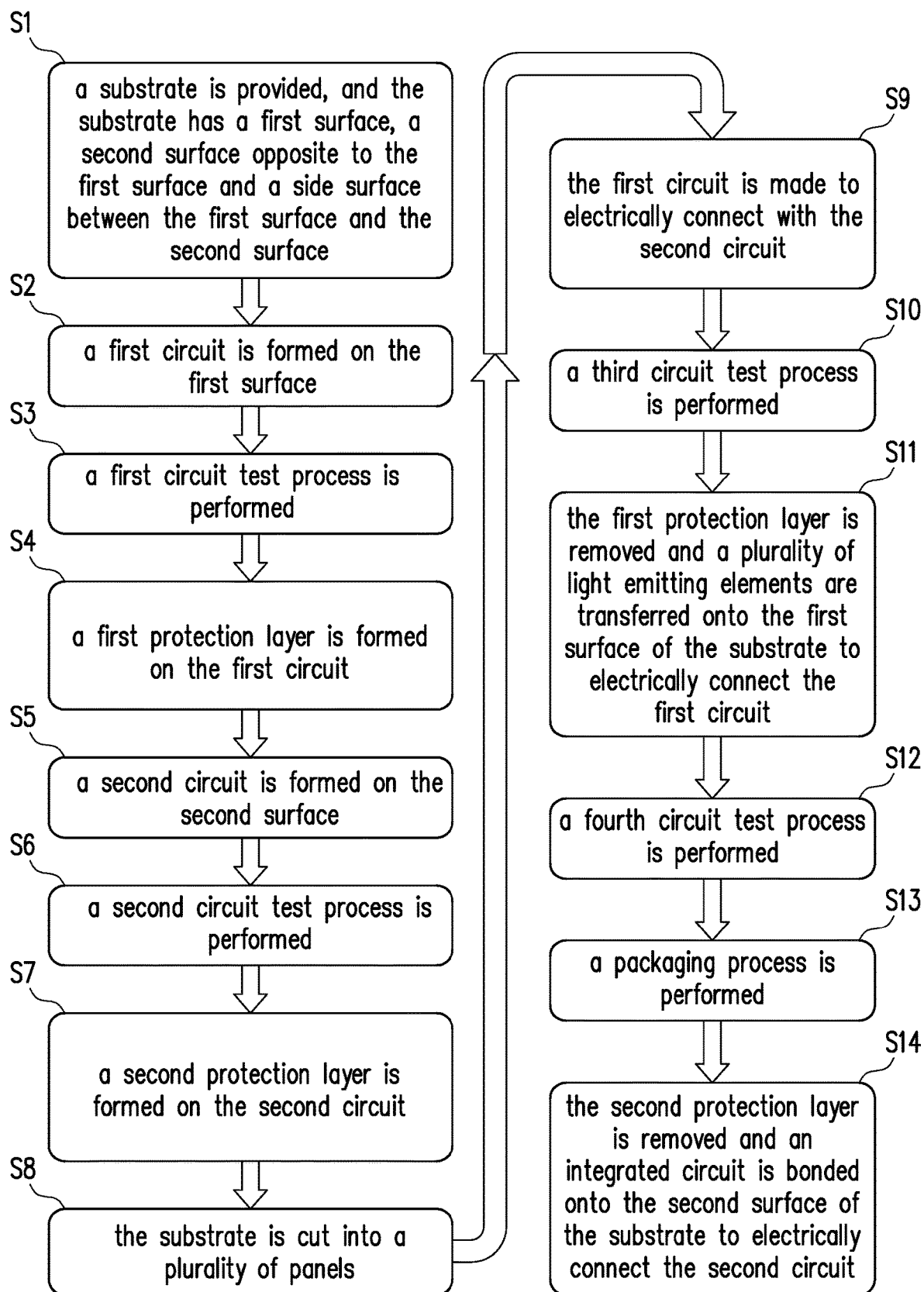
FIG. 1 is a flowchart of a method of manufacturing an electronic device according to an embodiment of the disclosure.

The disclosure can be understood by referring to the following detailed description in conjunction with the accompanying drawings. It should be noted that in order to make the reader easy to understand and for the sake of simplicity of the drawings, the multiple drawings in the disclosure only depict a part of the electronic device, and certain elements in the drawings are not drawn according to actual scale. In addition, the number and size of each element in the figure are only for illustration, and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

It should be understood that when an element or film is referred to as being "on" or "connected with" another element or layer, it can be directly on or directly connected with the other element or layer, or exist an intervening element or layer between the two (indirect case). In contrast, when an element is referred to as being "directly on" or "directly connected with" another element or layer, there are no intervening elements or layers present.

The terms "about", "approximately", and "substantially" generally mean that a feature value is within a range of 20% of a given value, or within 10%, 5%, 3%, 2%, 1%, or 0.5% of a given value. The quantity given in the specification is an approximate quantity, that is, even without specifying "about", "approximately", "substantially", it still implies the meaning of "about", "approximately" and "substantially". In addition, the phrase "in a range from a first value to a second value" indicates the range includes the first value, the second value, and other values in between.

Although the electronic device in the present disclosure includes a plurality of light emitting elements, it is only exemplary and for the sake of description. The electronic device of the disclosure may include a display device, an antenna device (such as liquid crystal antenna), a sensing device, a lighting device, a touch device, a curved device, a free shape device, a bendable device, flexible device, tiled device or a combination thereof, but is not limited thereto. The electronic device may include light-emitting diode (LED), liquid crystal, fluorescence, phosphor, other suitable materials or a combination thereof, but is not limited thereto. The light emitting diode may include organic light emitting diode (OLED), inorganic light emitting diode such as mini LED, micro LED or quantum dot (QD) light emitting diode (QLED or QDLED), other suitable type of LED or any combination of the above, but is not limited thereto. The display device may also include, for example, a tiled display device, but is not limited thereto. The antenna device may be, for example, a liquid crystal antenna, but is not limited thereto. The antenna device may include, for example, a tiled antenna device, but is not limited thereto. It should be noted that the electronic device can be any combination of the above, but is not limited thereto. The electronic device may have peripheral systems such as a driving system, a control system, a light source system, a shelf system, etc., to support a display device, an antenna device, or a tiled device. Hereinafter, an electronic device will be used to illustrate the content of the disclosure, but the disclosure is not limited thereto.

Although the terms first, second, third etc. can be used to describe various constituent elements, the constituent elements are not limited by the terms. The term is only used to distinguish a single constituent element from other constituent elements in the specification. The same terms may not be used in the claims, but may be replaced by first, second, third, etc. in the order of element declarations in the claims. Therefore, in the following specification, a first constituent element may be a second constituent element in the claims.

In some embodiments of the present disclosure, unless specifically defined otherwise, the terms related to joining and connection, such as "connected" and "interconnected", may refer to two structures being in direct contact, or may refer to two structures not being in direct contact and other structures are provided between the two structures. Moreover, the terms about joining and connecting may include a case where two structures are movable or two structures are fixed. In addition, the term "coupled" includes any direct and indirect electrical connection means.

It will be understood that when an element or layer is referred to as being "(electrically) connected with" another element or layer, it can be directly (electrically) connected with the other element or layer, or intervening elements or layers may be presented. In contrast, when an element is referred to as being "directly (electrically) connected with" another element or layer, there are no intervening elements or layers presented. In contrast, when an element is referred to as being "disposed on" or "formed on" A element, it may be directly disposed on (or formed on) A element, or may be indirectly disposed on (or formed on) A element through other component. In contrast, when an element is referred to as being "disposed between" A element and B element, it may be directly disposed between A element and B element, or may be indirectly disposed between A element and B element through other component.

It should be noted that the following embodiments can be replaced, recombined, and mixed to complete other embodiments without departing from the spirit of the present disclosure.

Reference will now be made in detail to the exemplary embodiments of the disclosure, examples of which are illustrated in the accompanying drawings. Whenever possible, the same reference numerals are used to represent the same or similar parts in the accompanying drawings and description.

Figure 11A:
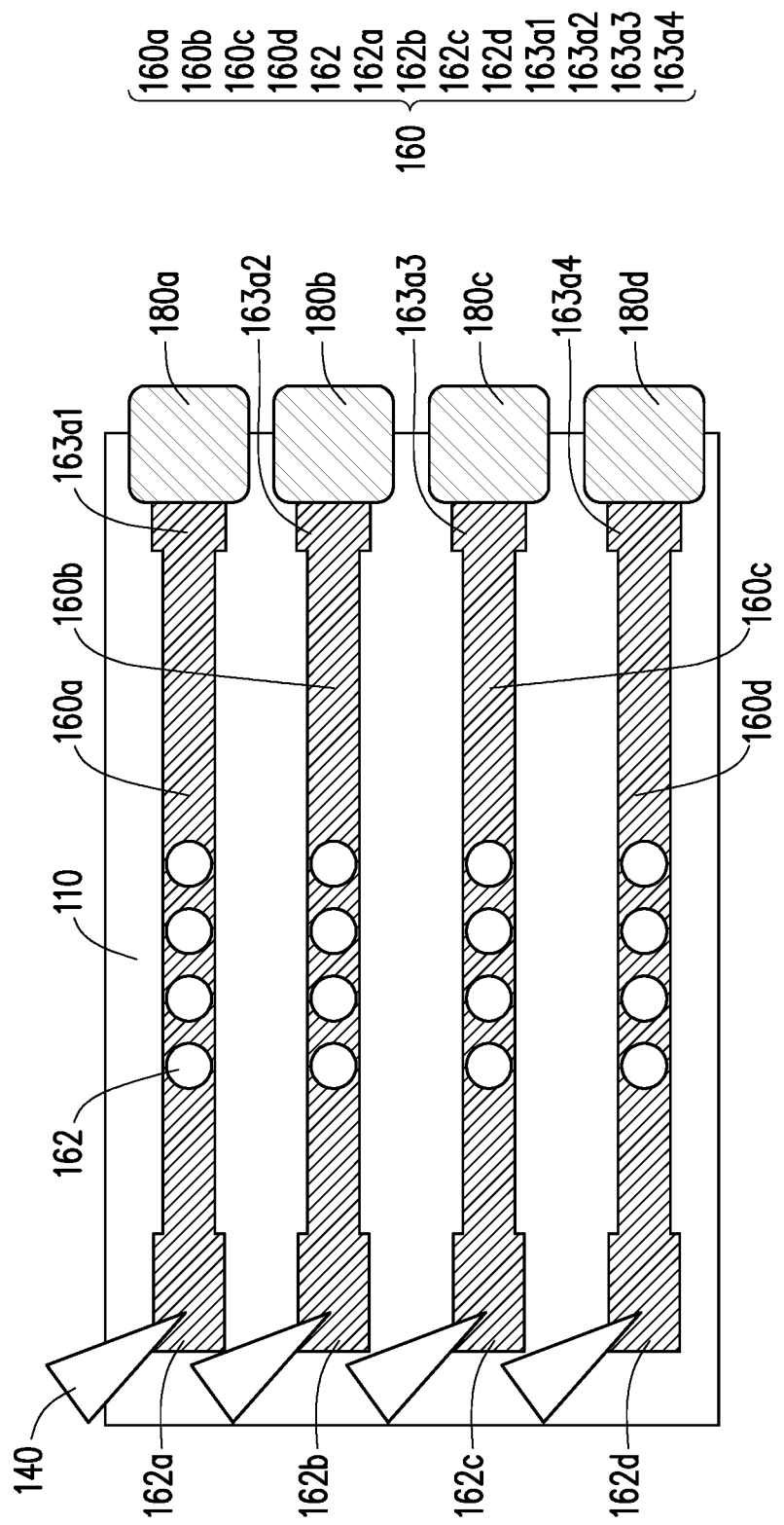
FIG. 11A is a schematic bottom view of the structure of FIG. 7B in performing the first electrical inspection.
Figure 11B:
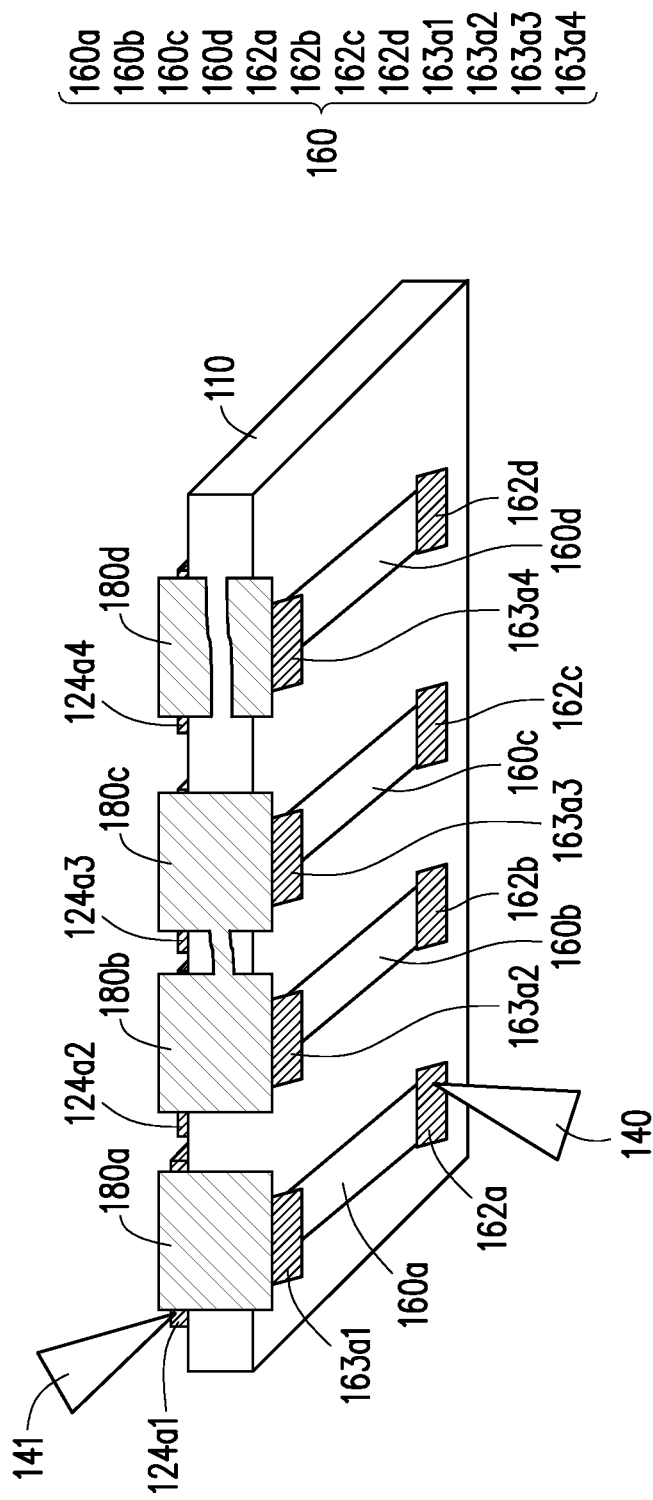
FIGS. 11B, 11C, and 11D are schematic three-dimensional views of the structure of FIG. 7B in performing a first electrical inspection.
Figure 11C:
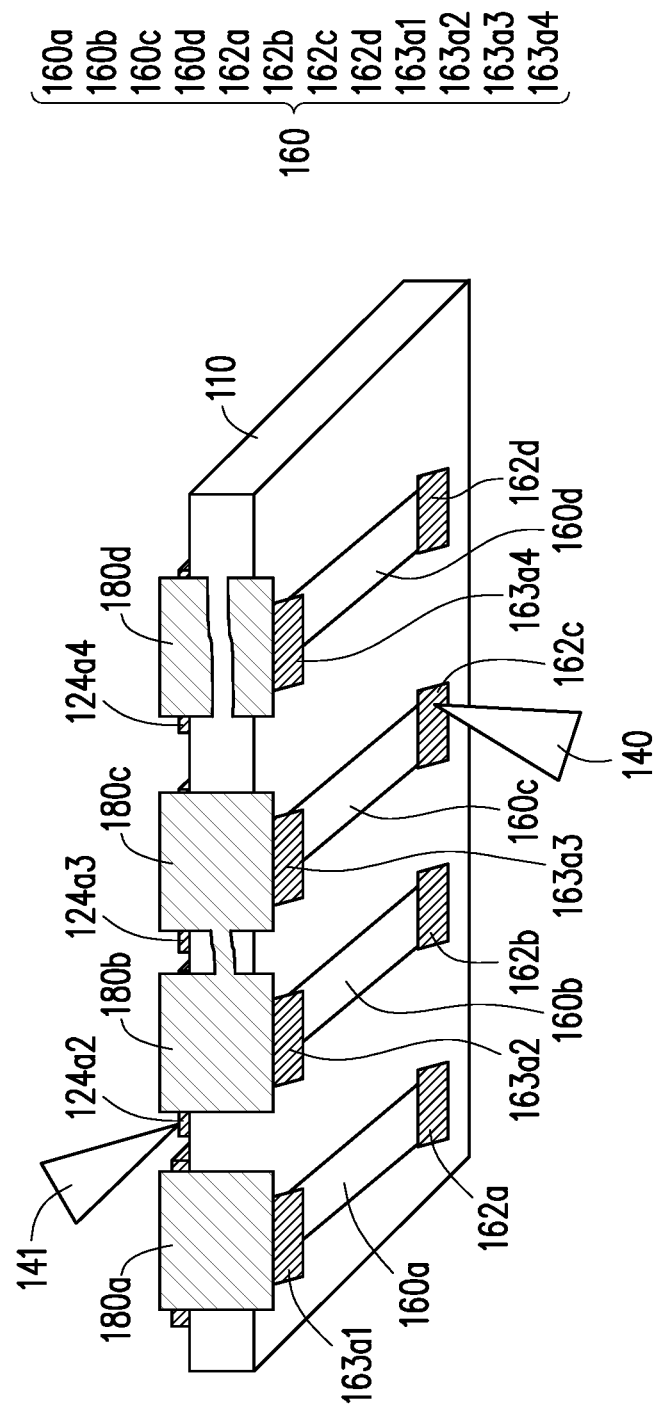
Figure 11D:
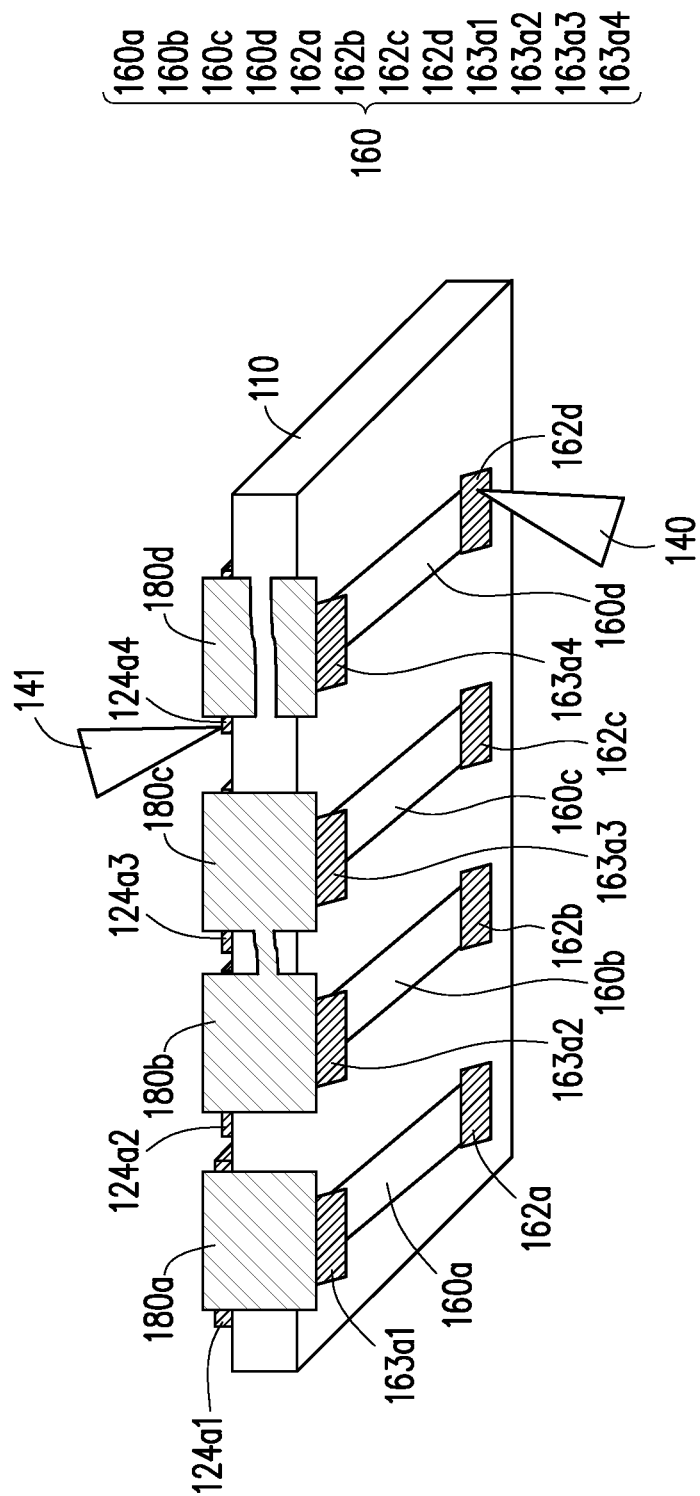
Figure 12A:
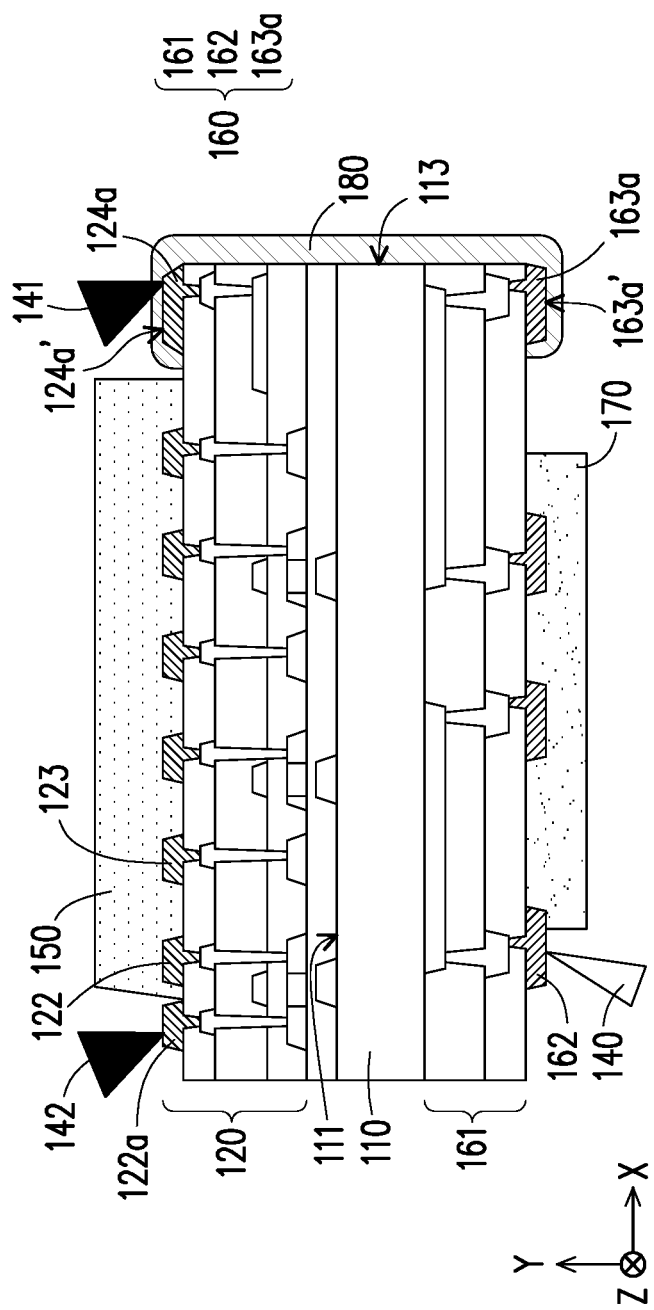
FIG. 12A is schematic cross-sectional view of the structure of FIG. 7B in performing a second electrical inspection.
Figure 12B:
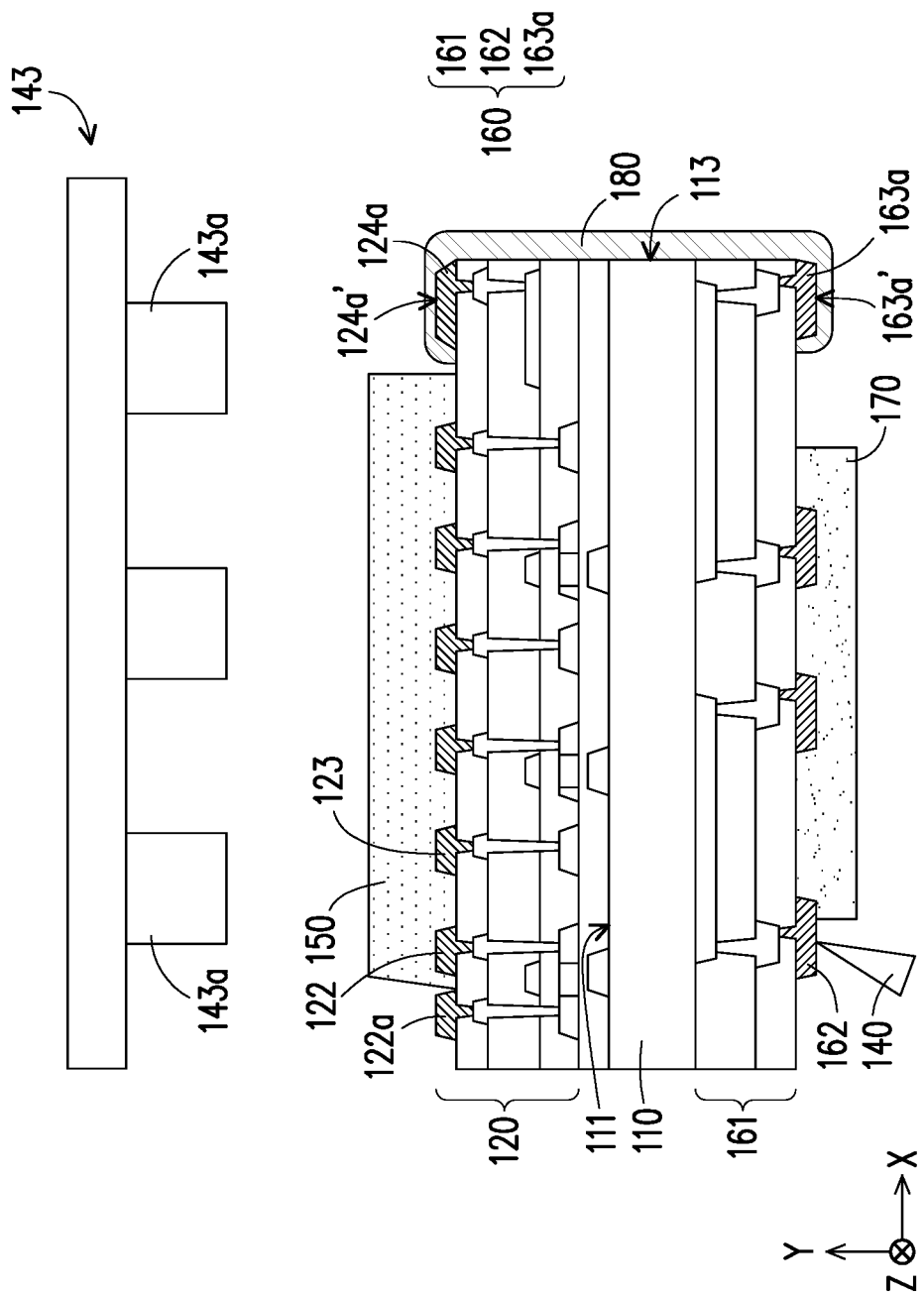
FIG. 12B is schematic cross-sectional view of the structure of FIG. 7B in performing a third electrical inspection.
Figure 13:
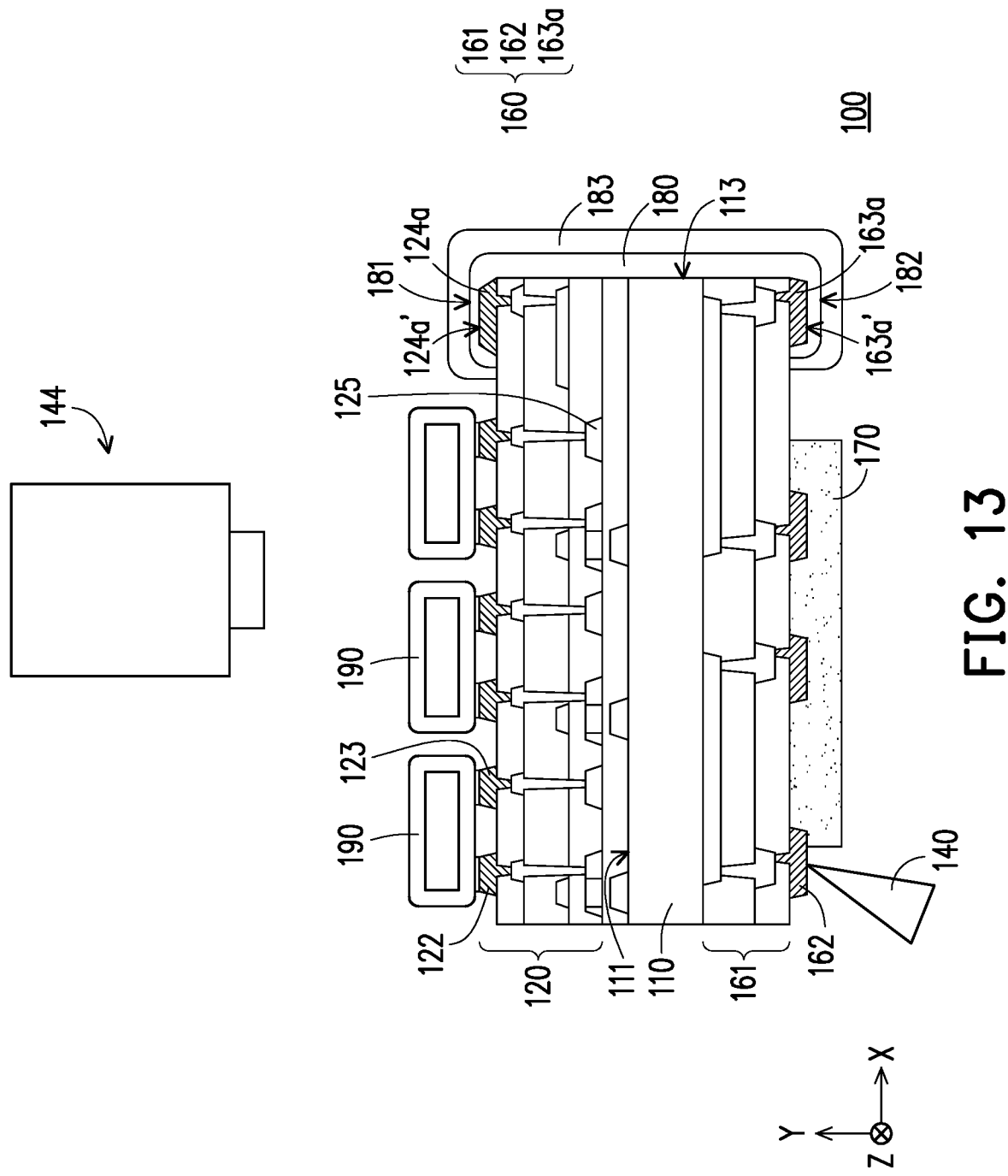
FIG. 13 is a schematic cross-sectional view of the structure of FIG. 8B in performing a fourth electrical inspection.

FIG. 1 is a flowchart of a method of manufacturing an electronic device according to an embodiment of the disclosure. FIGS. 2A, 3A, 4A, 5A, 6A, 7A, 8A, and 9A are schematic top views of a method of manufacturing an electronic device according to an embodiment of the disclosure. FIGS. 2B, 3B, 4B, 5B, 6B, 7B, 8B, and 9B are schematic cross-sectional views of the structure of FIG. 2A to FIG. 9A along the section line A-A'. FIG. 10A to FIG. 10B are schematic side views of the structure of FIG. 7B when performing an optical inspection. FIG. 11A is a schematic bottom view of the structure of FIG. 7B in performing the first electrical inspection. FIG. 11B to FIG. 11D are schematic three-dimensional views of the structure of FIG. 7B in performing a first electrical inspection. FIG. 12A is schematic cross-sectional view of the structure of FIG. 7B in performing a second electrical inspection. FIG. 12B is schematic cross-sectional view of the structure of FIG. 7B in performing a third electrical inspection. FIG. 13 is a schematic cross-sectional view of the structure of FIG. 8B in performing a fourth electrical inspection. For the sake of clarity and easy description of the drawings, FIG. 2A to FIG. 9A may omit illustration of several elements.

Figure 2A:
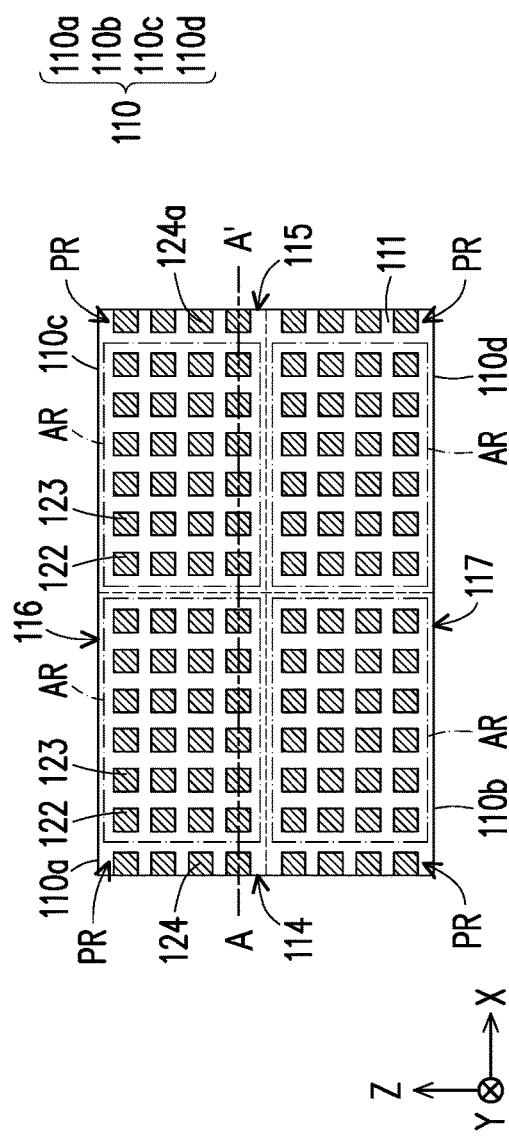
Figure 2B:
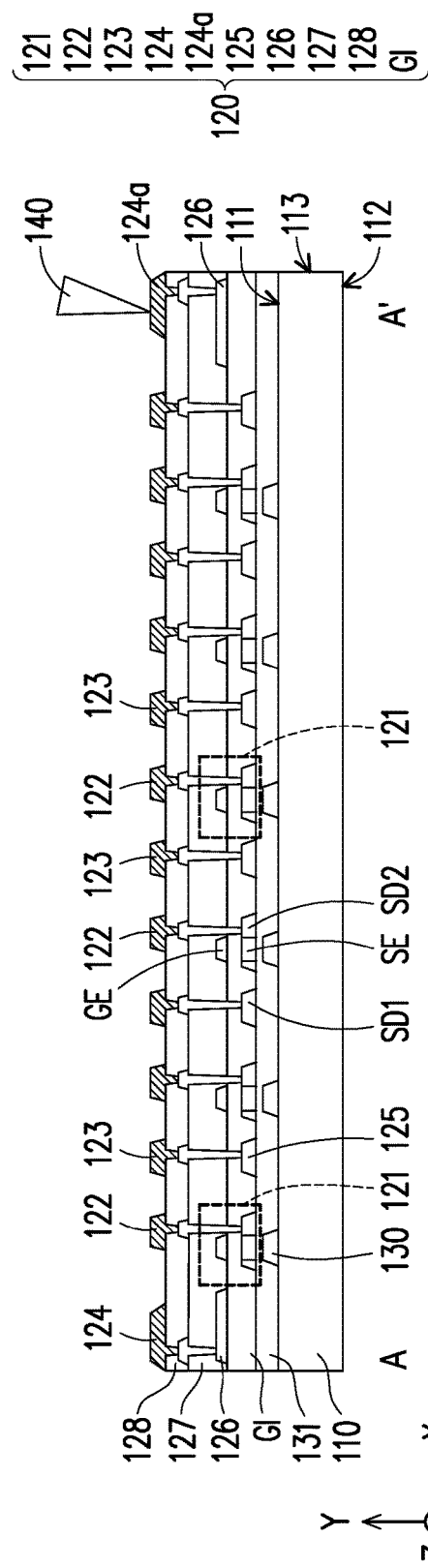

Referring to FIG. 1, FIG. 2A and FIG. 2B simultaneously, in the method of manufacturing the electronic device in the present embodiment, the steps S1, S2, and S3 can be sequentially performed. In the step S1, a substrate 110 is provided. The substrate 110 has a first surface 111, a second surface 112 opposite to the first surface 111 and a side surface 113 between the first surface 111 and the second surface 112. In the present embodiment, the substrate 110 may include four edges 114, 115, 116, and 117, wherein the edge 114 is opposite to the edge 115, and the edge 116 is opposite to the edge 117. The substrate 110 may include an area enough for a plurality of regions 110a, 110b, 110c, and 110d to manufacture the electronic devices (FIG. 2A schematically shows four regions, but is not limited thereto), and each of the regions 110a, 110b, 110c, and 110d includes an active region AR and a peripheral region PR on the first surface 111. On the other hand, the regions 110a, 110b, 110c, and 110d may respectively include a first region AR' (shown in FIG. 4A) corresponding to the active region AR and a second region PR' (shown in FIG. 4A) corresponding to the peripheral regions PR on the second surface. The peripheral regions PR are located corresponding to the edge 114 and the edge 115 of the substrate 110. In the present embodiment, the substrate 110 may include a rigid substrate, a flexible substrate or a combination thereof. For example, a material of the substrate 110 may include glass, quartz, sapphire, ceramics, polycarbonate (PC), polyimide (PI), polyethylene terephthalate (PET), other suitable substrate materials or a combination of the above, but is not limited thereto.

In the present embodiment, a direction X, a direction Y and a direction Z are different from each other. The direction X, the direction Y and the direction Z may be substantially perpendicular to each other. The direction Y may be, for example, a normal direction of the substrate 110, but the disclosure is not limited thereto.

In the step S2, a first circuit 120 is formed on the first surface 111 of the substrate 110. Specifically, in the present embodiment, before forming the first circuit 120, a plurality of light shielding elements 130 and a buffer layer 131 covering the light shielding elements 130 are formed on the first surface 111 of the substrate 110. Next, the first circuit 120 is formed on the buffer layer 131. The first circuit 120 may include layers, electronic elements and conductive lines, such as a plurality of transistors 121, a plurality of first bonding pads 122 and 123, a plurality of first conductive pads 124 and 124a, a plurality of first signal wires 125, a plurality of second signal wires 126, a insulation layer GI, a first passivation layer 127 and a second passivation layer 128, but is not limited thereto. In some embodiments, the first circuit 120 may include other electrical components, such as driver ICs and/or sensors, but is not limited thereto. One of the transistors 121 includes a gate electrode GE, a semiconductor layer SE, a source electrode SD1, a drain electrode SD2, and a portion of the insulation layer GI as a gate insulation layer, but is not limited thereto. It should be noted that each of the first bonding pads 122 and 123, the first conductive pads 124 and 124a, the first signal wires 125, and the second signal wires 126 may be a single-layered structure or a multiple-layered structure. On the other hand, in the present embodiment, the first bonding pads 122 and 123 may receive different kinds of signals, the first signal wires 125 can be used to transmit low voltage signals, and the second signal wires 126 can be used to transmit test signals, but the present disclosure is not limited thereto.

More specifically, the transistors 121 may be disposed on the buffer layer 131, and the semiconductor layers SE may be respectively disposed corresponding to the light shielding elements 130. The insulation layer GI is disposed on the buffer layer 131, and is disposed between the gate electrodes GE and the semiconductor layers SE. The first signal wires 125 may be disposed on the buffer layer 131 and may be covered by the insulation layer GI. The second signal wires 126 and the gate electrodes GE may be disposed on the insulation layer GI. The first passivation layer 127 is disposed on the insulation layer GI and covers the second signal wires 126 and the gate electrodes GE. The second passivation layer 128 may be disposed on the first passivation layer 127. The first bonding pads 122, the first bonding pads 123, the first conductive pads 124 and the first conductive pads 124a are respectively disposed on the second passivation layer 128. One of the first bonding pads 122 may be electrically connected with the corresponding one of the transistors 121. One of the first bonding pads 123 may be electrically connected with the corresponding one of the first signal wires 125. One of the first conductive pads 124 may be electrically connected with the corresponding one of the second signal wires 126. In addition, the transistors 121, the first bonding pads 122 and the first bonding pads 123 are disposed in the active regions AR of the regions 110a, 110b, 110c and 110d. The first conductive pads 124 and the first conductive pads 124a are disposed in the peripheral regions PR of the regions 110a, 110b, 110c and 110d. It should be noted that the top-gate structure shown in FIG. 2B is only exemplary, and it can be replaced to be a bottom-gate structure, a dual-gate structure, or a double-gate structure.

In the step S3, a first circuit test process is performed. Specifically, testing signals are applied to the first circuit 120 to test whether abnormal circuit issues happen in the first circuit 120. For example, firstly, a testing signal is applied to one of the first conductive pads 124a (or the first conductive pads 124) of the first circuit 120 by contacting a signal probe 140. Then, a tested signal may be received from one of the first conductive pads 124 (or the first conductive pads 124a) of the first circuit 120 to verify the electrical connection in the first circuit 120 (e.g., the electrical connection between the one of the first conductive pads 124a and the one of the first conductive pads 124 in the first circuit 120), thereby inspecting whether the open circuit, short circuit, or other abnormal circuit issues happen in the first circuit 120 or not. It should be noted that the testing can be repeatedly performed to verify all the first circuit 120. In the present embodiment, the tested signal may be an electrical signal, for example, a predetermined voltage or current, but is not limited thereto.

Figure 3A:
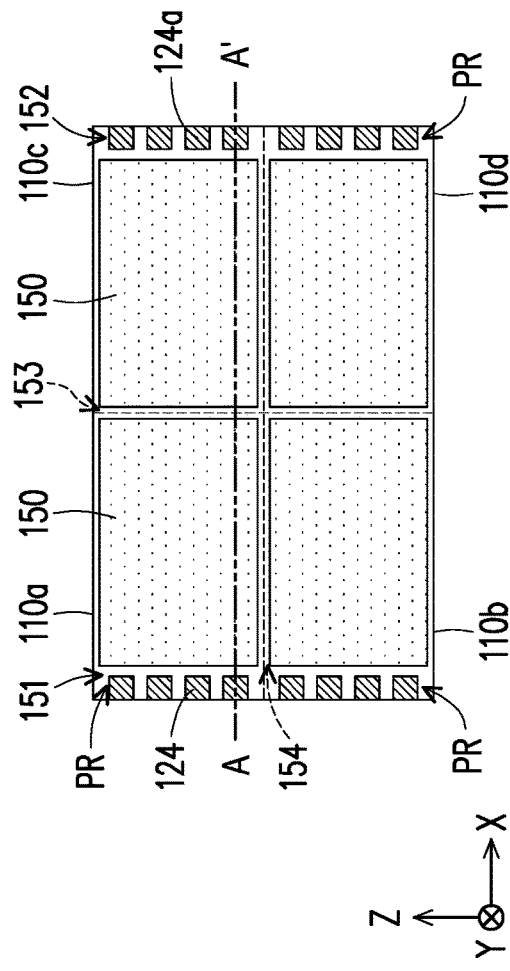
Figure 3B:
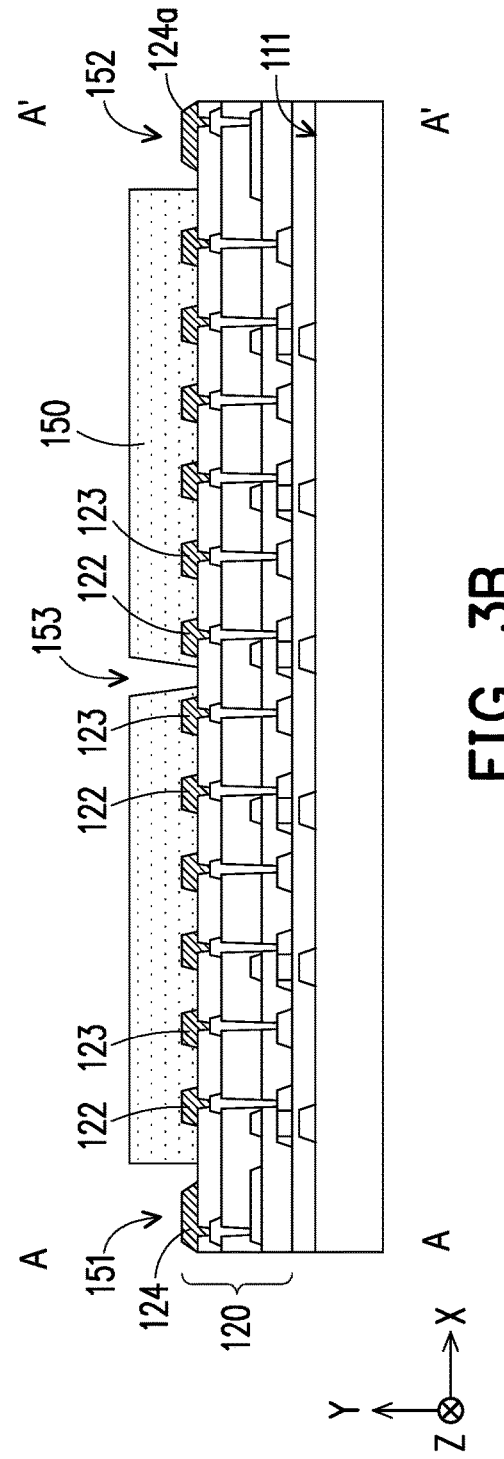

Referring to FIG. 1, FIG. 3A and FIG. 3B simultaneously, the step S4 is performed. In the step S4, a first protection layer 150 is formed on the first circuit 120 to cover and protect the plurality of first bonding pads 122 and 123 of the first circuit 120, but the disclosure is not limited thereto. In the present embodiment, the first protection layer 150 may be a single-layered or multi-layered structure, and may include, for example, organic materials, inorganic materials, or a combination of the above, but is not limited thereto. The organic material may include, for example, a polymer material such as polyimide resin, epoxy resin or acrylic resin, other suitable materials, or a combination thereof. The inorganic material may include, for example, silicon oxide, silicon nitride, silicon oxynitride or a stacked layer of at least two of the above materials, other suitable materials, or a combination thereof. In the present embodiment, a thickness of the first protection layer 150 is, for example, 2 μm to 20 μm (2 μm≤thickness≤20 μm), such as 5 μm, 10 μm or 15 μm, but is not limited thereto.

A plurality of first openings 151 and 152 and a plurality of first cutting lanes 153 and 154 are located adjacent to the first protection layer 150. It should be noted that there are only two first openings 151 and 152 and only two first cutting lanes 153 and 154 in FIG. 3A, but the number of the first openings and the first cutting lanes are not limited thereto. It should be noted that some portions of the openings 151 and 152 and the cutting lanes 153 and 154 may overlap each other. The first opening 151 (or the first opening 152) is located in the peripheral regions PR of the region 110a and the region 110b (or the region 110c and the region 110d) to expose one or more first conductive pads 124 (or the first conductive pads 124a) of the first circuit 120. In the present embodiment, the first opening 151 and the first opening 152 are trenches, but are not limited thereto. Similarly, in some embodiments, the first cutting lane 153 and/or the first cutting lane 154 may expose one or more conductive pads (not shown).

The first cutting lane 154 may be parallel to the direction X. The first cutting lane 153 may be parallel to the direction Z. The first cutting lane 153 may intersect and may be substantially perpendicular to the first cutting lane 154. The first cutting lane 153 may be located corresponding to a boundary between the adjacent regions 110a and 110c and a boundary between the adjacent regions 110b and 110d. The first cutting lane 154 may be located corresponding to a boundary between the adjacent regions 110a and 110b and a boundary between the adjacent regions 110c and 110d. It should be noted that the boundary between two regions is a predetermined cutting line to separate the two regions.

Figure 4A:
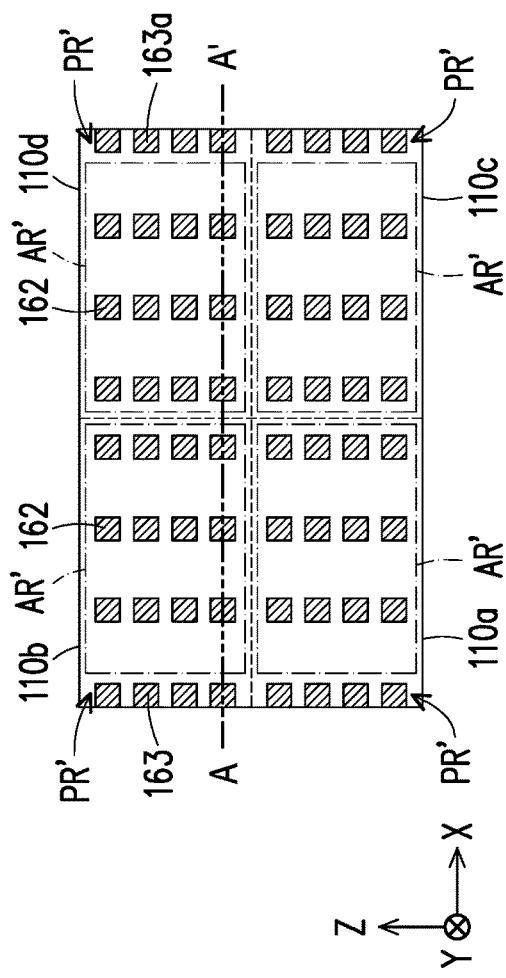
Figure 4B:
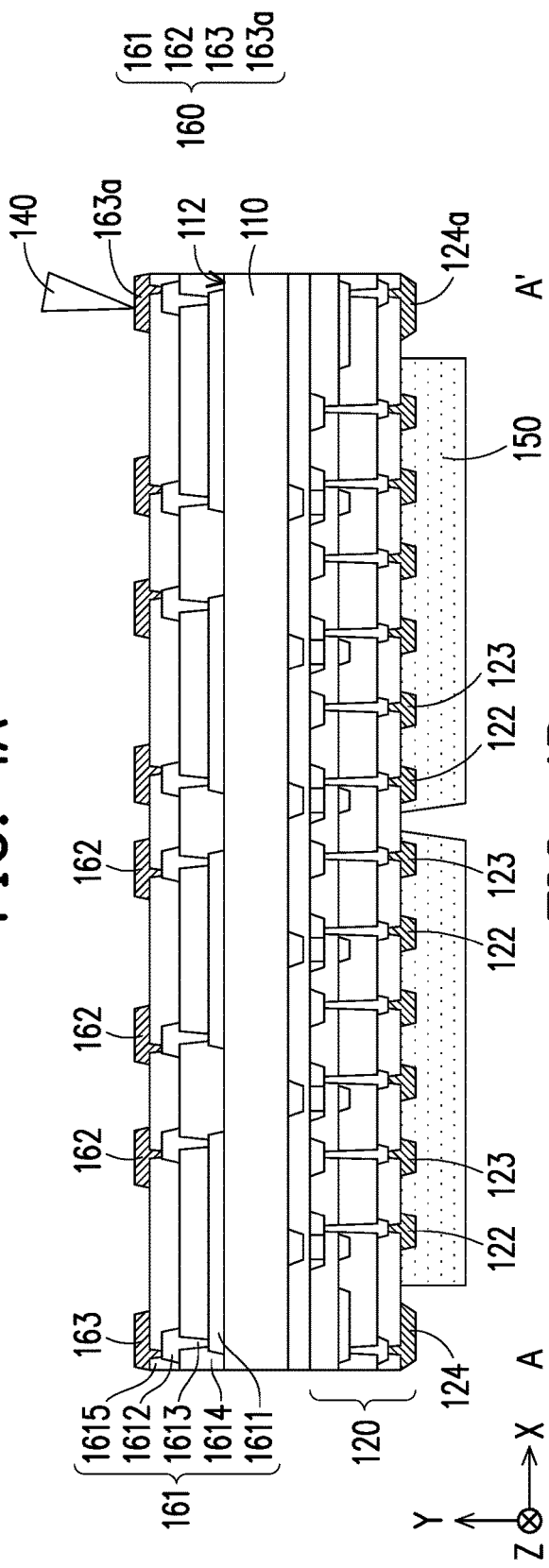
Figure 6A:
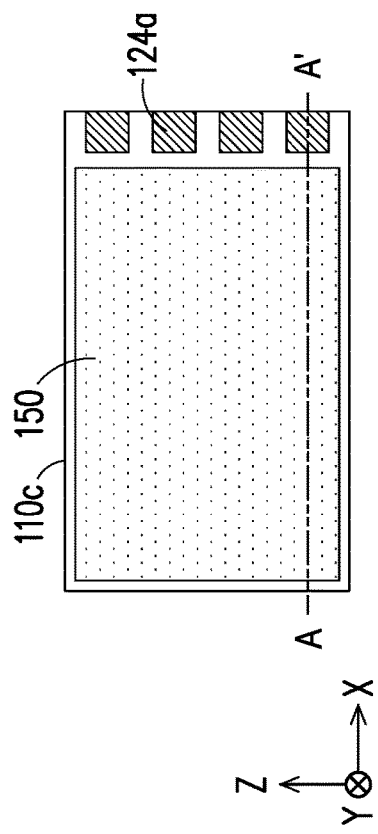
Figure 6B:
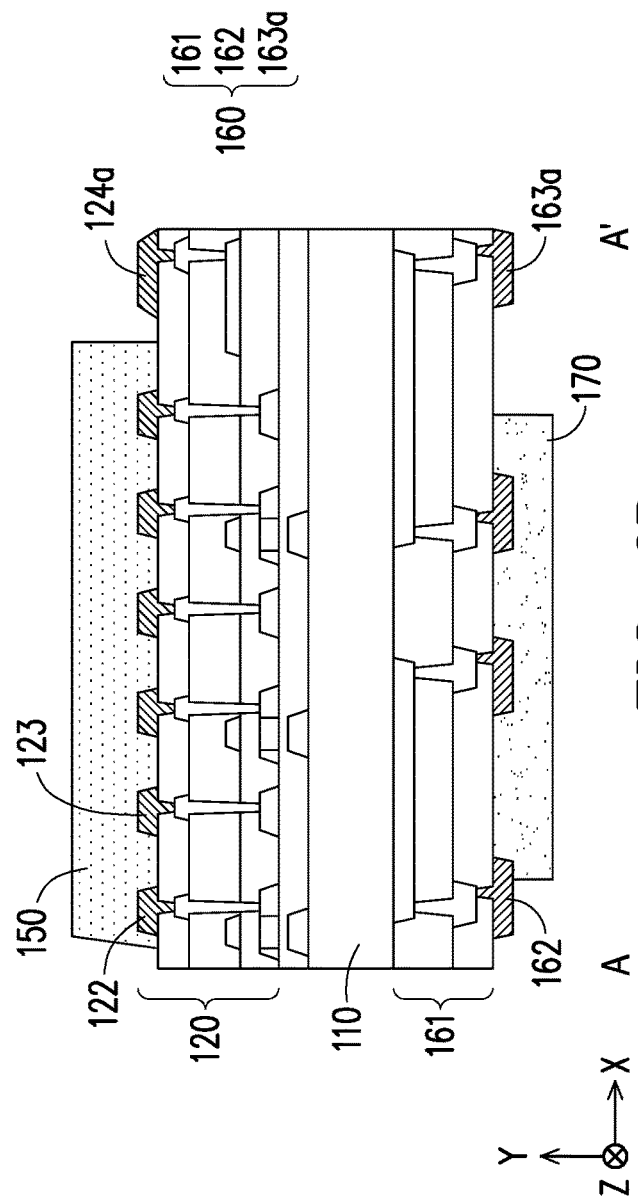

Referring to FIG. 1, FIG. 4A and FIG. 4B simultaneously, the steps S5 and S6 are sequentially performed. In the step S5, a second circuit 160 is formed on the second surface 112 of the substrate 110. Specifically, the second circuit 160 may include a redistribution layer 161, a plurality of second bonding pads 162 and a plurality of second conductive pads 163 and 163a, but is not limited thereto. The redistribution layer 161 may include a plurality of first conductive elements 1611, a plurality of second conductive elements 1612, a plurality of conductive vias 1613, a third passivation layer 1614 and a fourth passivation layer 1615, but is not limited thereto.

More specifically, the first conductive elements 1611 may be disposed on the second surface 112 of the substrate 110. The third passivation layer 1614 may be disposed on the second surface 112 of the substrate 110 and may cover the first conductive elements 1611. The second conductive elements 1612 may be disposed on the third passivation layer 1614. The fourth passivation layer 1615 may be disposed on the third passivation layer 1614 and may cover the second conductive elements 1612. The conductive vias 1613 penetrate the third passivation layer 1614, and the first conductive elements 1611 may be electrically connected with the corresponding second conductive elements 1612 respectively. It should be noted that the first conductive elements 1611 may be formed by patterning a layer, and the second conductive elements 1612 may be may be formed by patterning a layer, but the disclosure is not limited thereto. The second bonding pads 162 and the second conductive pads 163 and 163a may be respectively disposed on the fourth passivation layer 1615 and may be respectively electrically connected with the corresponding second conductive elements 1612. In addition, the second bonding pads 162 may be disposed in the first regions AR' of the regions 110a, 110b, 110c and 110d. The second conductive pads 163 and 163a may be disposed in the second regions PR' of the regions 110a, 110b, 110c and 110d. The plurality of first conductive pads 124 and 124a may overlap the second conductive pads 163 and 163a in the normal direction (direction Y) of the substrate 110. Specifically, one of first conductive pads 124 and 124a may at least partially overlap an area of its corresponding second conductive pads 163 and 163a in a top view.

In the step S6, a second circuit test process is performed. Specifically, a testing signal is applied to the second circuit 160 to test whether abnormal circuit issues happen in the second circuit 160. For example, firstly, the testing signal may be applied to the second conductive pads 163a (or the second conductive pads 163) of the second circuit 160 by contacting a signal probe 140. Then, a tested signal may be received from the second conductive pads 163 (or the second conductive pads 163a) of the second circuit 160 to verify the electrical connection in the second circuit 160 (e.g., the electrical connection between the one of the first conductive pads 163a and the one of the first conductive pads 163 in the second circuit 160), thereby inspecting whether the open circuit, short circuit, or other abnormal circuit issues happen in the second circuit 160. It should be noted that the testing can be repeatedly performed to verify all the second circuit 160.

Referring to FIG. 1, FIG. 5A and FIG. 5B simultaneously, the step S7 is performed. In the step S7, a second protection layer 170 is formed on the second circuit 160 to cover and protect the plurality of second bonding pads 162 of the second circuit 160. In the present embodiment, the structure and the material of the second protection layer 170 may be the same with or similar to the first protection layer 150, so it will not be repeated herein.

A plurality of second openings 171 and 172 and a plurality of second cutting lanes 173 and 174 may be located adjacent to the second protection layer 170. It should be noted that there are only two second openings 171 and 172 and only two second cutting lanes 173 and 174 in FIG. 5A, but the number of the second openings and the second cutting lanes are not limited thereto. The second opening 171 (or the second opening 172) may be located in the peripheral regions PR of the region 110a and the region 110b (or the region 110c and the region 110d) to expose one or more second conductive pads 163 (or the second conductive pads 163a) of the second circuit 160. In the present embodiment, the second opening 171 and the second opening 172 are trenches, but are not limited thereto. In the present embodiment, the second opening 171 and the second opening 172 may extend in a direction parallel to the direction Z. The second openings 171 may expose at least a portion of the second conductive pads 163 and the second openings 172 may expose at least a portion of the second conductive pads 163a. Similarly, in some embodiments, the second cutting lane 173 and/or the first cutting lane 174 may expose one or more conductive pads (not shown). The second cutting lane 174 parallel to the direction X. The second cutting lane 173 is parallel to the direction Z. The second cutting lane 173 may intersect and may be substantially perpendicular to the second cutting lane 174. The second cutting lane 173 may be located corresponding to a boundary between the adjacent regions 110a and 110c and a boundary between the adjacent regions 110b and 110d. The first cutting lane 174 may be located corresponding to a boundary between the adjacent regions 110a and 110b and a boundary between the adjacent regions 110c and 110d. In the present embodiment, the first cutting lanes 153 and 154 may overlap the second cutting lanes 173 and 174 in the normal direction (direction Y) of the substrate.

Referring to FIG. 1, FIGS. 5A-6A and FIGS. 5B-6B simultaneously, the step S8 is performed. In the step S8, the substrate 110 is cut into a plurality of pieces respectively corresponding to the regions 110a, 110b, 110c and 110d. Specifically, the substrate 110 is cut along the first cutting lane 153 and the first cutting lane 154 (or the second cutting lanes 173 and the second cutting lanes 174) by a cutting tool, and each of the regions 110a, 110b, 110c and 110d of the substrate 110 is separated from each other.

Figure 7A:
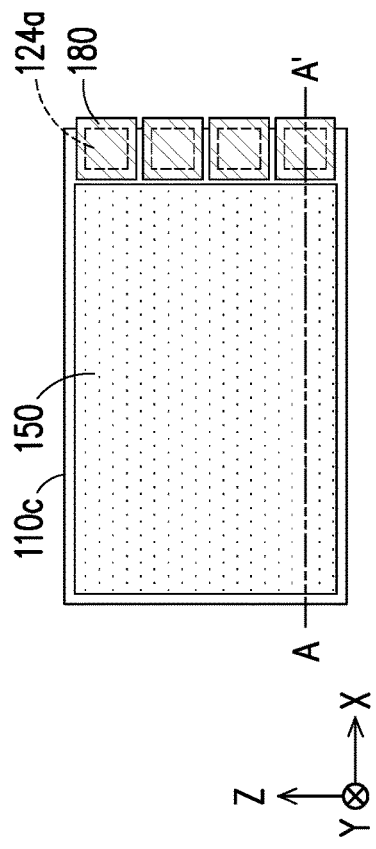
Figure 7B:
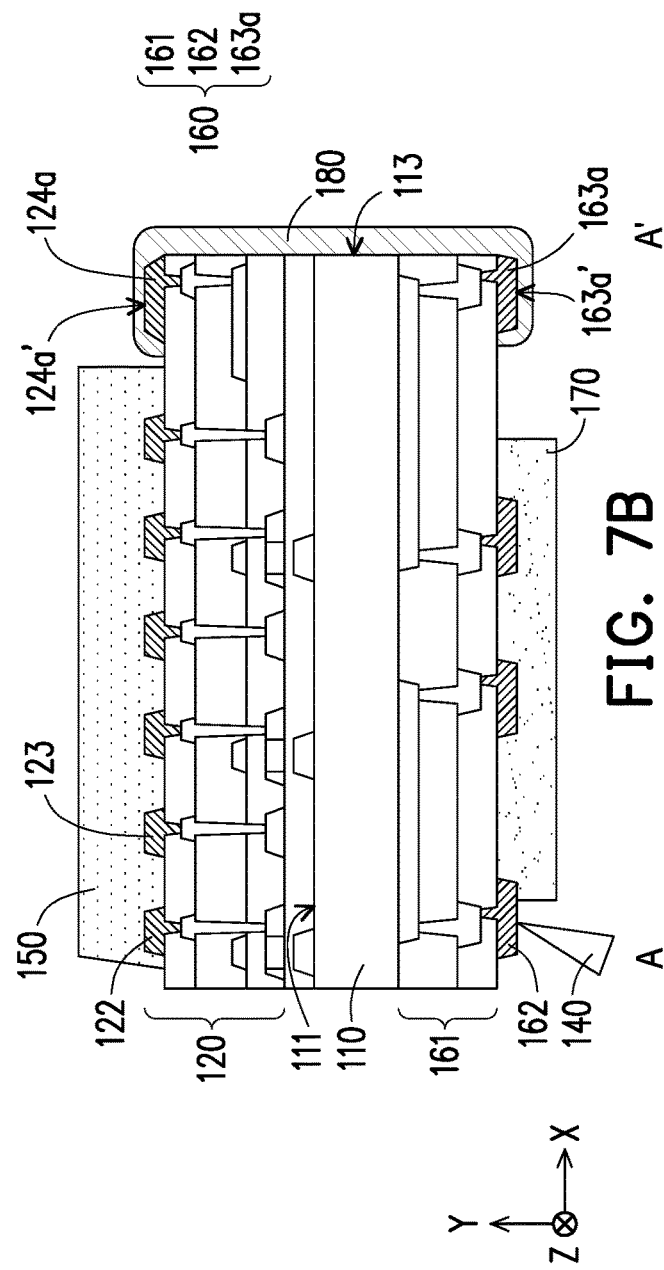

Referring to FIG. 1, FIG. 7A and FIG. 7B simultaneously, the step S9 is performed. In the step S9, the first circuit 120 is made to electrically connect with the second circuit 160. For example, in the present embodiment, the first circuit 120 may be made to electrically connect with the second circuit 160 by forming a connecting pattern 180 on the side surface 113 of the substrate 110, but is not limited thereto. The connecting pattern 180 may be regarded as a conductive pattern on the side surface 113 of the substrate 110, the side surface of the first circuit 120, and/or the side surface of the second circuit 160. In the present embodiment, the material of the connecting pattern 180 may include metals such as silver, gold, copper, etc., and the material may be presented in a slurry state or presented as metal wires formed on a film, or contained in nanoparticles which are mixed in a colloidal resin, but is not limited thereto. A thickness of the connecting pattern 180 may be 0.1 μm to 50 μm (0.1 μm≤thickness≤50 μm) such as 2 μm, 5 μm, or 15 μm, but is not limited thereto.

In the present embodiment, the connecting pattern 180 may extend from the side surface 113 of the substrate 110 toward the first circuit 120 and the second circuit 160 to contact a top surface 124a' of at least one of the plurality of first conductive pads 124a of the first circuit 120 and a bottom surface 163a' of at least one of the plurality of second conductive pads 163a of the second circuit 160. In some embodiments, the connecting pattern 180 may contact the side portion of the at least one of the first conductive pads 124a and/or the side portion of the at least one of the second conductive pads 163a rather than contacting the top surface 124a' and/or the bottom surface 163a'. In some embodiments, there may be an intervening conductive element between the connection pattern 180 and the at least one of the first conductive pads 124a (or the at least one of the second conductive pads 163a) to form an electrical connection.

Referring to FIG. 1, FIGS. 10A-10B, FIGS. 11A-11D and FIGS. 12A-12B simultaneously, the step S10 is performed. In the step S10, a third circuit test process is performed. Specifically, the third circuit test process may include at least one of an optical inspection, a first electrical inspection, a second electrical inspection and/or a third electrical inspection. In FIGS. 10A-10B, the connecting patterns 180a, 180b, 180c, 180d, 180e, 180f and 180g are shown as exemplary connecting patterns, but the shapes of the connecting patterns are not limited thereto. In addition, since the first circuit 120 may be electrically connected with the second circuit 160 through at least one of the connecting patterns 180a, 180b, 180c, 180d, 180e, 180f, and 180g, the electrical connection of the first circuit 120 and the second circuit 160 may be verified.

In the optical inspection, an optical microscope may be used to observe whether there are abnormal issues such as open circuit, short circuit, insufficient line width, insufficient pitch, holes and/or particles in the connecting patterns 180a, 180b, 180c, 180d, 180e, 180f, and/or 180g. For example, as shown in FIGS. 10A-10B, the result of the optical inspection indicates only the structures of the connecting pattern 180a and the connecting pattern 180e are complete, and the other connecting patterns 180b, 180c, 180d, 180f, and 180g are incomplete. In the present embodiment, the minimum widths W1 of the connecting pattern 180a and the connecting pattern 180e may be equal to or greater than 15 µm to obtain a relatively lower impedance. However, since there is an electrical shortcut 180' between the adjacent connecting patterns 180b and 180c, the connecting pattern 180b and the connecting pattern 180c may have a short circuit issue due to the electrical shortcut 180'. Since there is a gap 180" in the structure of the connecting pattern 180d, the connecting pattern 180d has an open circuit issue. Since the minimum width W2 of the connecting pattern 180f may be less than 15 um, the connecting pattern 180f may have a relatively higher impedance issue due to the insufficient line width. Since there are holes 180''' or particles (not shown) in the structure of the connecting pattern 180d, the connecting pattern 180d has a relatively higher impedance issue.

For example, as shown in FIGS. 11A-11D, in the first electrical inspection, at least one signal probe 140 and at least one signal receiving probe 141 are used to inspect whether there are abnormal circuit issues in the connecting patterns 180a, 180b, 180c and 180d and the corresponding parts 160a, 160b, 160c and 160d of the second circuit 160. In the present embodiment, testing signals are respectively applied to the second bonding pads 162a, 162b, 162c and 162d of the second circuit 160 by contacting the signal probes 140, and then tested signals are respectively received from the corresponding first conductive pads 124a1, 124a2, 124a3 and 124a4 of the first circuit 120 by at least one signal receiving probe 141 (shown in FIGS. 11B-11D), and the electrical connections between the second bonding pads 162a, 162b, 162c and 162d and the corresponding first conductive pads 124a1, 124a2, 124a3 and 124a4 (e.g., the connecting patterns 180a, 180b, 180c, and 180d, the corresponding parts 160a, 160b, 160c and 160d of the second circuit 160, and the second conductive pads 163a1, 163a2, 163a3 and 163a4, etc.) may be verified. In the present embodiment, the testing signal and the tested signal may be electrical signals, such as predetermined voltages or currents, but is not limited thereto. In some embodiments, the testing signal may be an electrical signal, and the tested signal may be a signal different from the testing signal, such as a processed electrical signal or a light signal, but the type of the tested signal is not limited thereto.

Next, as shown in FIG. 11B, when the corresponding first conductive pad 124a1 receives the tested signal corresponding to the testing signal from the second bonding pad 162a. it indicates that the connecting pattern 180a may be normally electrically connected with the second bonding pad 162a of the second circuit 160a. As shown in FIG. 11C, when the non-corresponding first conductive pad 124a2 receives the tested signal corresponding to the testing signal from the second bonding pads 162c, it indicates that there may be a short circuit issue in the electrical connection between the second bonding pads 162c and first conductive pad 124a2, such as the connecting pattern 180c or the corresponding part 160c of the second circuit 160. As shown in FIG. 11D, when it does not receive the tested signal which is corresponding to the testing signal from the second bonding pads 162d from the first conductive pads 124a4 cannot, it indicates that there may be an open circuit issue in the electrical connection between the second bonding pads 162d and first conductive pad 124a4, such as in the connecting pattern 180d or the corresponding part 160d of the second circuit 160.

For example, as shown in FIG. 12A, in the second electrical inspection, a signal probe 140 and two signal receiving probes 141 and 142 may be used to inspect whether there are abnormal circuit issues in the first circuit 120, the connecting pattern 180 and the second circuit 160. In the present embodiment, at least a portion of the first bonding pads 122a may be exposed by an additional patterning process or the first cutting lane(s) with greater width(s). The signal probe 140 provides a testing signal to the second bonding pad 162 of the second circuit 160, the signal receiving probe 141 receives a first tested signal from the first conductive pad 124a of the first circuit 120, and the signal receiving probe 142 receives a second tested signal from the exposed first bonding pads 122a of the first circuit 120. That is, the testing signal is applied to the second bonding pad 162 of the second circuit 160, and then two tested signals are respectively received from the first conductive pad 124a and the exposed first bonding pads 122a of the first circuit 120 to verify the electrical connection between the first circuit 120 and the second circuit 160. In the present embodiment, the testing signal and the two tested signals may be electrical signals, for example, the testing signal may be a predetermined voltage or current, and the two tested signals may be processed electrical signals different from the testing signal, but is not limited thereto.

In the present embodiment, when it receives a tested signal from the first conductive pads 124a, and the tested signal is corresponding to the testing signal from the second bonding pad 162, it indicates that the connecting pattern 180 may be electrically connected with the second bonding pad 162 of the second circuit 160. In addition, when it receives the tested signal from the exposed first bonding pads 122a and the tested signal is corresponding to the testing signal from the second bonding pad 162, it indicates that the first bonding pads 122a of the first circuit 120 may be electrically connected with the second bonding pad 162 of the second circuit 160.

For example, as shown in FIG. 12B, in the third electrical inspection, a signal probe 140 and a modulator 143 may be used to inspect whether there are abnormal circuit issues in the first circuit 120, the connecting pattern 180 and the second circuit 160. In the present embodiment, the signal probe 140 provides a testing signal to the second bonding pad 162 of the second circuit 160, and the modulator 143 disposed over the first circuit 120 may receive the tested signals from the first bonding pads 122 and 123. That is, the testing signal is applied to the second bonding pad 162 of the second circuit 160, and then the tested signals (such as electric fields) from the first bonding pads 122 and 123 may be respectively received by the modulator 143 to verify the electrical connection between the first circuit 120 and the second circuit 160. In the present embodiment, the testing signal may be an electrical signal and the tested signals may be the electric fields, but is not limited thereto. In the present embodiment, the modulator 143 may have a plurality of units 143a, and the units 143a may detect the electric fields from the first bonding pads 122 and 123.

In the present embodiment, when the testing signal is applied to the second bonding pad 162 and is transmitted and/or processed to form the tested signals (electric fields), and the modulator 143 receives the tested signals (e.g., electric fields) from the first bonding pads 122 and 123, it indicates that the first bonding pads 122a of the first circuit 120 may be electrically connected with the second bonding pad 162 of the second circuit 160.

Figure 8A:
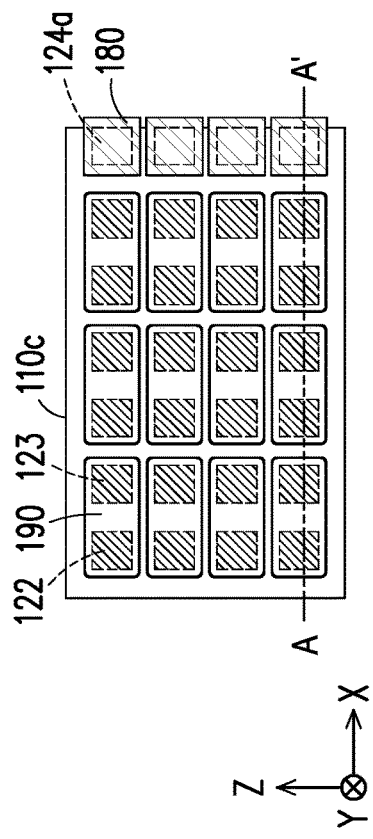
Figure 8B:
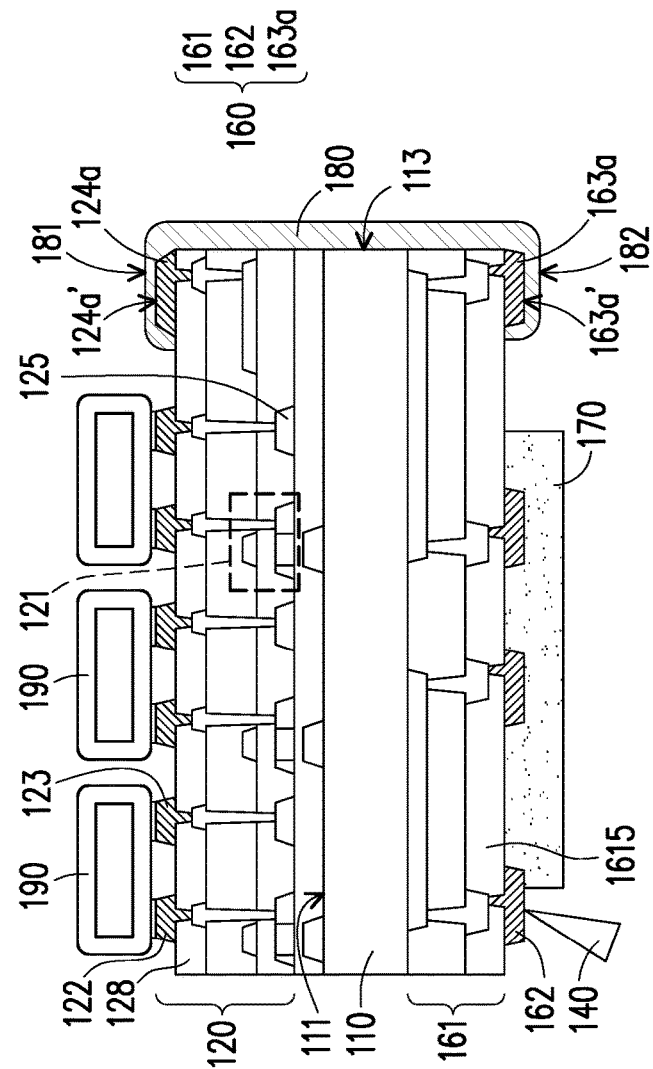

Referring to FIGS. 8B and 9B simultaneously. Next, in the present embodiment, after the third circuit test process, an insulation layer 183 may be optionally formed on the connecting pattern 180. Specifically, the insulation layer 183 may cover an upper surface 181, a side surface and a lower surface 182 of the connecting pattern 180. The upper surface 181 of the connecting pattern 180 farthest from the second circuit 160 is located on the top surface 124a' of the first conductive pad 124a, and the lower surface 182 of the connecting pattern 180 farthest from the first circuit 120 is located on the bottom surface 163a' of the second conductive pad 163a, but the positions of the upper surface 181 and the lower surface 182 are not limited thereto. In some embodiments, the upper surface 181 may be a surface of a portion of the connection pattern 180 that the portion is higher than the second passivation layer 128 along the Y-direction, similarly, and the lower surface 182 may be a surface of another portion of the connection pattern 180 that the another portion is lower than the fourth passivation layer 1615 along the Y-direction. The insulation layer 183 may be a single-layered or multi-layered structure, and may include, for example, organic materials, inorganic materials, or a combination of the above, but is not limited thereto. The organic material may include, for example, perfluoroalkoxy alkanes (PFA), resin, other suitable materials, or a combination of the above. The inorganic material includes, for example, silicon oxide or silicon nitride, other suitable materials, or a combination of the above.

Referring to FIG. 1, FIG. 8A and FIG. 8B simultaneously, the step S11 is performed. In the step S11, the first protection layer 150 is removed, and a plurality of electronic elements (e.g., light emitting elements 190) may be transferred onto the first surface 111 of the substrate 110 to electrically connect the first circuit 120 to form a panel. For example, the first protection layer 150 may be removed to expose the first bonding pads 122 and 123 which may not be exposed in the previous steps. Next, after removing all or part of the first protection layer 150 and exposing the first bonding pads 122 and 123, the light emitting elements 190 are transferred and bonded to the first bonding pads 122 and 123 of the first circuit 120. The light-emitting elements 190 are electrically connected with the corresponding transistors 121 and the corresponding first signal wires 125 respectively. It should be noted that in the present disclosure, a panel is formed by including the light emitting elements 190 and the previously built structure which may include the substrate 110, the first circuit 120, the second circuit 160, and the connection pattern 180.

Referring to FIG. 1 and FIG. 13 simultaneously, the step S12 is performed. In the step S12, a fourth circuit test process is performed. For example, as shown in FIG. 13, a signal probe 140 and an optical instrument 144 may be used to analyze the spectrum and/or the brightness of the light emitting elements 190. In the present embodiment, the signal probe 140 provides a testing signal to the second bonding pad 162 of the second circuit 160, and the optical instrument 144 disposed over the first circuit 120 receives tested signals from the light emitting elements 190. That is, the testing signal is applied to the second bonding pad 162 of the second circuit 160, and then the tested signals (such as light signals) emitted from the light emitting elements 190 are respectively detected by the optical instrument 144 to verify the electrical connection between the light emitting elements 190 and the second circuit 160. In the present embodiment, the testing signal may be an electrical signal, and the tested signals may be the light signals, but is not limited thereto. In the present embodiment, the optical instrument 144 may be, for example, a spectrometer, an LED measurement device, a photometer, an illuminance meter, or an optical spectrum analyzer, but is not limited thereto.

In the present embodiment, when the testing signal is applied to the second bonding pad 162 and the optical instrument 144 receives the light signals from the light emitting elements 190, it indicates that the light emitting elements 190 may be electrically connected with the second bonding pad 162 of the second circuit 160.

Referring to FIG. 1, FIG. 9A and FIG. 9B simultaneously, the step S13 is performed. In the step S13, a packaging process is performed. Specifically, a molding compound 192 is formed on the first surface 111 of the substrate 110 to encapsulate the light-emitting elements 190, the first bonding pads 122 and 123 and a portion of the insulation layer 183.

Finally, referring to FIG. 1 and FIG. 13, the step S14 is performed. In the step S14, the second protection layer 170 is removed and at least one integrated circuit (IC) (not shown) is bonded onto the second surface 112 of the substrate 110 to electrically connect the second circuit 160 to manufacture an electronic device. Specifically, after removing all or a part the second protection layer 170 and exposing the second bonding pads 162 which may not be exposed in the previous steps, the at least one integrated circuit is bonded onto the second bonding pads 162 of the second circuit 160 to electrically connect with the corresponding second bonding pads 162 of the second circuit 160. It should be noted that in the present disclosure, an electronic device may be defined by including at least a panel which is formed in the above mentioned steps S1 to S13, and at least one integrated circuit bonded onto the panel.

In the present embodiment, although the method of manufacturing the electronic device 100 starts with the substrate 110 and then cuts it into the pieces after forming the second circuit 160, but is not limited to thereto. In some embodiments, the electronic device 100 may be manufactured without cutting the substrate 110. That is, the electronic device 100 may be manufactured according to the steps S1-S7 and S9-S14, and the step S8 is omitted.

In the present embodiment, although the protection layers (e.g., the first protection layer 150 and the second protection layer 170) are respectively formed on the first surface 111 and the second surface 112 of the substrate 110, but is not limited thereto. In some embodiments, the protection layer may also be formed only on the first surface 111 or the second surface 112 of the substrate 110, that is, only one protection layer (e.g., the first protection layer 150 or the second protection layer 170) may be formed.

In the present embodiment, when verifying the electrical connection between the first circuit 120 and the second circuit 160, the testing signals are applied to the second circuit 160 and the tested signals are received from the first circuit 120, but it is not limited thereto. In some embodiments, the testing signals may also be applied to the first circuit 120 and the tested signals may be received from the second circuit 160.

In short, in the method of manufacturing the electronic device of the present embodiment, by performing the first circuit test process, the second circuit test process, the third circuit test process and/or the fourth circuit test process, the electrical connection between the light emitting elements 190 and the second circuit 160 may be verified to reduce the abnormal circuit issues happening in the manufactured electronic devices. By forming the connecting pattern 180 on the side surface 113 of the substrate 110, the electrical connection of the first circuit 120 and the second circuit 160 may be verified during the manufacturing processes of the electronic devices.

Other embodiments will be illustrated below. It must be noted that, the following embodiments use the component numbers and parts of the foregoing embodiments, in which the same reference numerals are used to indicate the same or similar components, and the description of the same technical content is omitted. For the description of the omitted parts, reference may be made to the foregoing embodiments, and is not repeated in the following embodiments.

Figure 14:
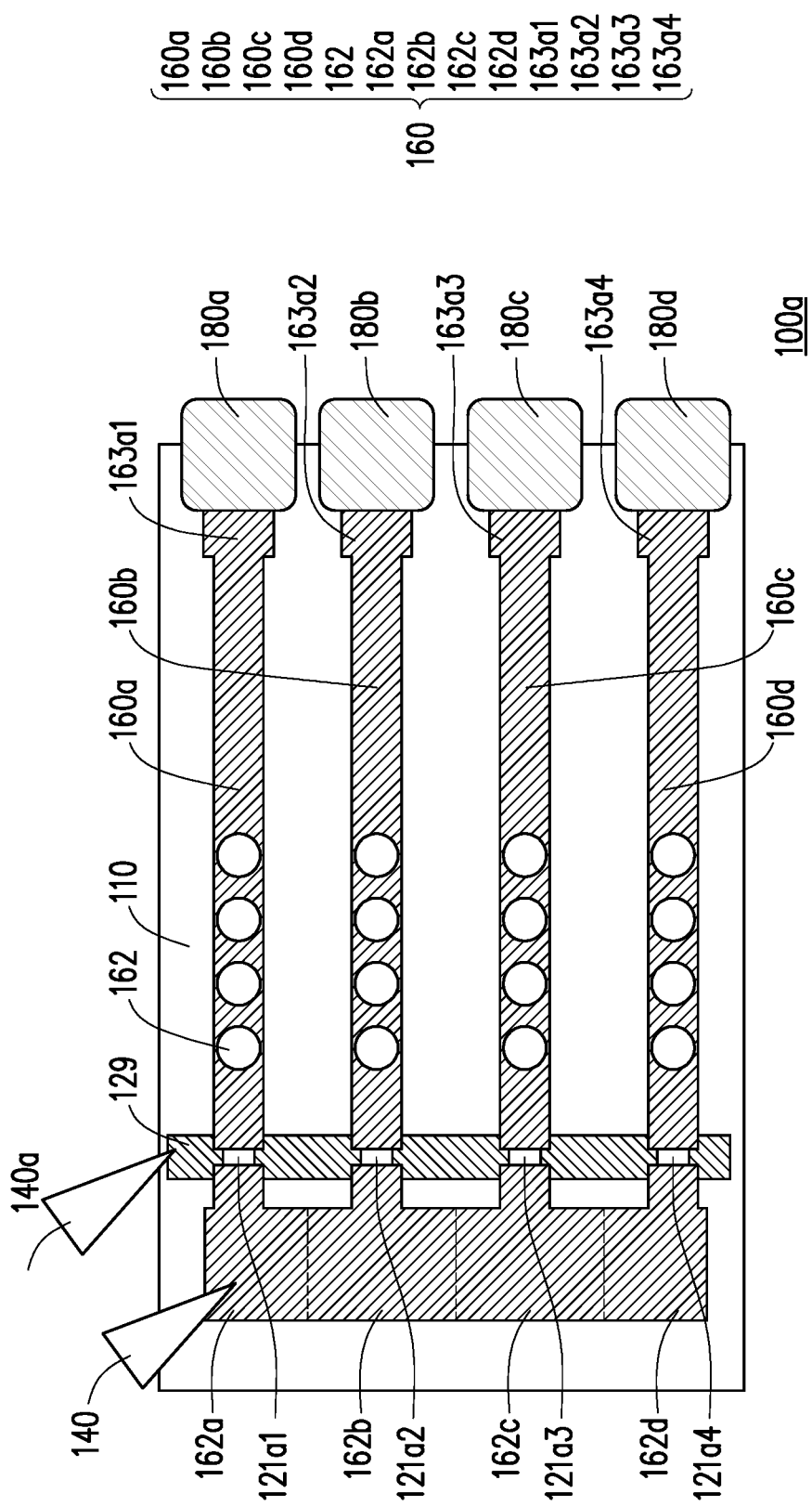
FIG. 14 is schematic bottom view of an structure in performing a third electrical inspection according to an embodiment of the disclosure.

FIG. 14 is schematic bottom view of a structure in performing a third circuit test process according to an embodiment of the disclosure. Please refer to FIG. 11A and FIG. 14 at the same time, a structure 100a in the present embodiment is substantially similar to the structure shown in FIG. 11A. The electronic device 100a of the present embodiment is different from the structure in FIG. 11A mainly in that: the electronic device 100a may further include a scanning wire 129 and a plurality of switching elements 121a1, 121a2, 121a3 and 121a4 to reduce a number of contacts between a signal probe 140 and the second bonding pads 162a, 162b, 162c and 162d.

Specifically, the second bonding pads 162a, 162b, 162c and 162d of the second circuit 160 are electrically connected with each other. The switching elements 121a1, 121a2, 121a3 and 121a4 may be disposed between the second bonding pads 162a, 162b, 162c and 162d and the corresponding parts 160a, 160b, 160c and 160d of the second circuit 160. The switching elements 121a1, 121a2, 121a3 and 121a4 may control the electrical connections between the second bonding pads 162a, 162b, 162c and 162d and the corresponding parts 160a, 160b, 160c and 160d of the second circuit 160. The scanning wire 129 may be disposed to control the switching elements 121a1, 121a2, 121a3 and 121a4. In the present embodiment, the switching elements 121a1, 121a2, 121a3 and 121a4 may include transistors, but it is not limited thereto.

More specifically, in the present embodiment, a testing signal is applied to the second bonding pad 162a by contacting the signal probe 140. The testing signal may be transmitted to the second bonding pads 162b, 162c and 162d, and the signal probe 140 does not have to contact the second bonding pads 162b, 162c and 162d, thereby reducing the possibility that the second bonding pads 162b, 162c and 162d may be damaged by the signal probe 140. Next, scanning signals may be applied to the scanning wire 129 by a signal probe 140a. According to a time sequence, the scanning signals may be respectively transmitted to turn on the switching elements 121a1, 121a2, 121a3 and 121a4. Since the switching elements 121a1, 121a2, 121a3 and 121a4 may be sequentially turned on, the testing signal may be transmitted from the second bonding pads 162a, 162b, 162c and 162d to the corresponding parts 160a, 160b, 160c and 160d of the second circuit 160. Thereby, the electrical connection between the second circuit 160 and the connecting patterns 180a, 180b, 180c and 180d may be verified sequentially, but the testing sequence is not limited thereto.

Therefore, in the present embodiment, by the design of the scanning wire 129, the switching elements 121a1, 121a2, 121a3 and 121a4 and the connection of the second bonding pads 162a, 162b, 162c and 162d, the second bonding pads 162b, 162c and 162d may have less probability to be damaged by the signal probe 140.

Figure 15A:
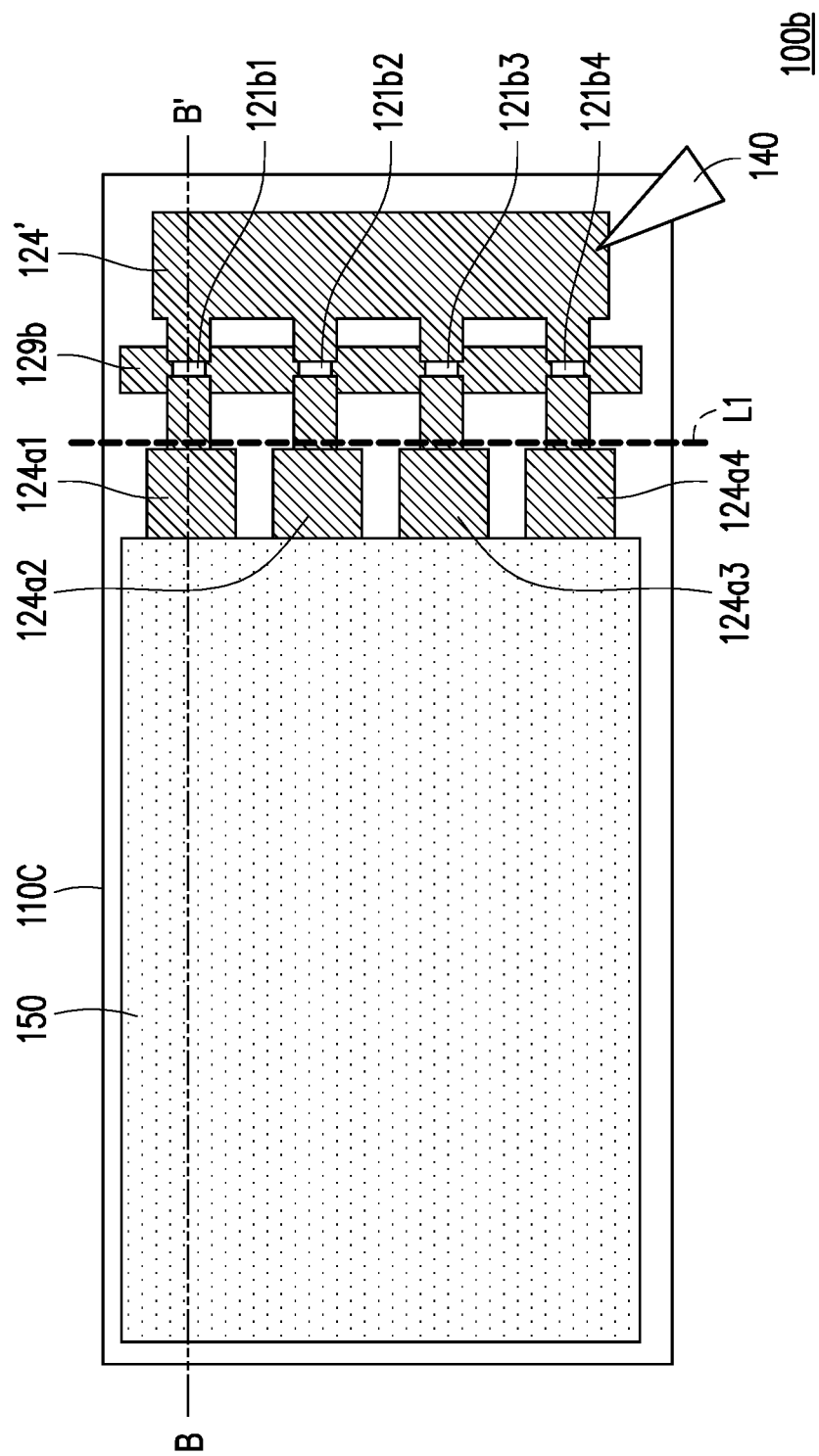
FIG. 15A is a schematic top view of an structure in performing a circuit test process according to another embodiment of the disclosure.
Figure 15B:
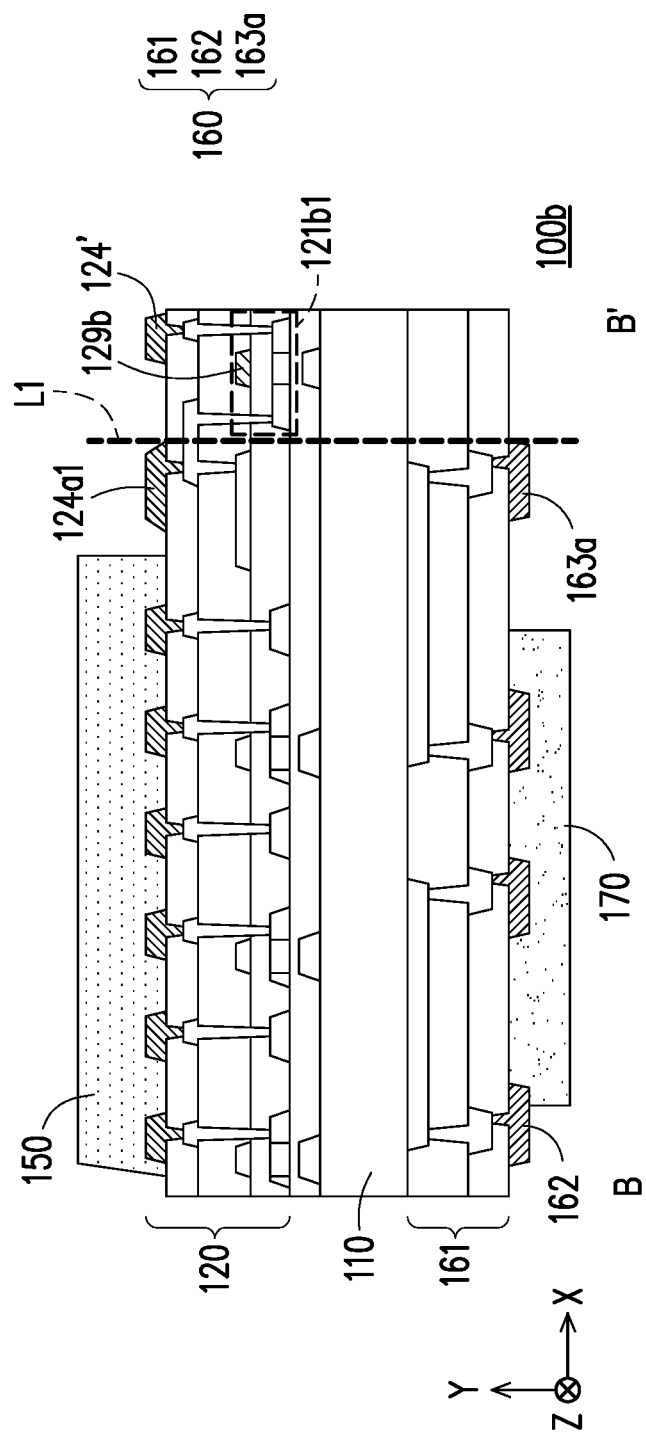
FIG. 15B is schematic cross-sectional view of the structure of FIG. 15A along the section line B-B'.

FIG. 15A is a schematic top view of a structure in performing a circuit test process according to another embodiment of the disclosure. FIG. 15B is schematic cross-sectional view of the structure of FIG. 15A along the section line B-B'. For the sake of clarity and easy description of the drawings, FIG. 15A omits illustration of several elements. Please refer to FIG. 6A, FIG. 6B and FIGS. 15A-15B at the same time, a structure 100b in the present embodiment is substantially similar to the structure shown in FIG. 6A and FIG. 6B. The structure 100b of the present embodiment is different from the embodiment shown in FIG. 6A and FIG. 6B mainly in that: the structure 100b may further include a scanning wire 129b, a plurality of switching elements 121b1, 121b2, 121b3 and 121b4 and a test pads 124' to conveniently verify the electrical connection in the first circuit 120.

Specifically, the switching elements 121b1, 121b2, 121b3 and 121b4 are disposed between the first conductive pads 124a1, 124a2, 124a3 and 124a4 and the test pads 124'. The switching elements 121b1, 121b2, 121b3 and 121b4 may control the connections between the first conductive pads 124a1, 124a2, 124a3 and 124a4 and the test pads 124'. The scanning wire 129b may be disposed to control the switching elements 121b1, 121b2, 121b3 and 121b4. In the present embodiment, the switching elements 121a1, 121a2, 121a3 and 121a4 may include transistors, but it is not limited thereto.

More specifically, in the present embodiment, testing signals are applied to the test pads 124' by a signal probe 140. Next, according to a time sequence, the scanning signals are applied to the scanning wire 129b to sequentially turn on the switching elements 121b1, 121b2, 121b3 and 121b4. Since the switching elements 121b1, 121b2, 121b3 and 121b4 may be sequentially turned on, the testing signals may be sequentially transmitted from the test pads 124' to the corresponding first conductive pads 124a1, 124a2, 124a3 and 124a4 of the first circuit 120. Thereby, the electrical connection in the first circuits 120 may be verified.

Therefore, in the present embodiment, by the design of the scanning wire 129b, the switching elements 121b1, 121b2, 121b3 and 121b4 and the test pads 124', the electrical connection in the complicated first circuits 120 may be simply verified. Next, after the subsequent circuit test process is completed and before the connecting pattern is formed, the scanning wire 129b, the switching elements 121b1, 121b2, 121b3 and 121b4 and the test pads 124' may be removed by the cutting tool along a cutting line L1.

In summary, in the method of manufacturing the electronic device of the present embodiment, by performing the first circuit test process, the second circuit test process, the third circuit test process and the fourth circuit test process, the electrical connection between the light emitting elements and the second circuit may be verified to reduce the abnormal circuit issues happening in the manufactured electronic devices. By disposing the connecting pattern on the side surface of the substrate, the electrical connection of the first circuit disposed on the first surface of the substrate and the second circuit disposed on the second surface of the substrate may be verified simultaneously. Therefore, the method of manufacturing an electronic device of the present embodiment may make the manufactured electronic device have better reliability.

It will be apparent to those skilled in the art that various combinations, modifications, and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   a substrate;
   an electronic element disposed on the substrate;
   a transistor electrically connected with the electronic element;
   a redistribution layer;
   a plurality of first bonding pads disposed corresponding to the electronic element, wherein the transistor is electrically connected with the electronic element through the plurality of first bonding pads; and
   a plurality of second bonding pads disposed on the redistribution layer,
   wherein the transistor is disposed between the plurality of first bonding pads and the substrate.

2. The electronic device as claimed in claim 1, wherein at least two of the plurality of first bonding pads receive different signals.

3. The electronic device as claimed in claim 1, further comprises:
   an integrated circuit electrically connected with the redistribution layer through the plurality of second bonding pads.

4. The electronic device as claimed in claim 1, wherein the redistribution layer comprises a plurality of conductive patterns, and the plurality of second bonding pads are disposed corresponding to the plurality of conductive patterns.

5. The electronic device as claimed in claim 4, wherein the plurality of conductive patterns comprises a plurality of first conductive patterns and a plurality of second conductive patterns, the plurality of second bonding pads are disposed corresponding to the plurality of second conductive patterns, and a number of the plurality of first bonding pads is greater than a number of the plurality of second bonding pads in a cross-sectional view.

6. The electronic device as claimed in claim 1, further comprising:
   a connecting pattern electrically connected with the transistor and the redistribution layer, wherein a portion of the connecting pattern extends in a normal direction of the substrate.

7. The electronic device as claimed in claim 6, further comprising:
   a circuit layer including the transistor, wherein a length of the portion of the connecting pattern extends in the normal direction of the substrate is greater than a thickness of the circuit layer.

8. The electronic device as claimed in claim 1, wherein the electronic element comprises light emitting element.

9. The electronic device as claimed in claim 1, further comprising:
   an integrated circuit disposed corresponding to the plurality of second bonding pads.

10. The electronic device as claimed in claim 1, further comprising:
    an integrated circuit electrically connected with the electronic element through a connecting pattern electrically connected with the transistor and the redistribution layer.

* * * * *